(12) United States Patent
Kang et al.

(10) Patent No.: US 11,670,537 B2
(45) Date of Patent: Jun. 6, 2023

(54) METHOD OF MANUFACTURING SEMICONDUCTOR DEVICE HAVING BURIED GATE ELECTRODES

(71) Applicant: Samsung Electronics Co., Ltd., Suwon-si (KR)

(72) Inventors: Byung-jae Kang, Suwon-si (KR); Yun-jung Kim, Seoul (KR); Se-min Yang, Seoul (KR); Ki-bum Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 29 days.

(21) Appl. No.: 17/167,170

(22) Filed: Feb. 4, 2021

(65) Prior Publication Data

US 2021/0183689 A1  Jun. 17, 2021

Related U.S. Application Data

(63) Continuation of application No. 16/540,228, filed on Aug. 14, 2019, now Pat. No. 10,930,544.

(30) Foreign Application Priority Data

Jan. 25, 2019  (KR) ........................ 10-2019-0010063

(51) Int. Cl.
*H01L 21/762* (2006.01)
*H10B 12/00* (2023.01)
*H01L 27/108* (2006.01)

(52) U.S. Cl.
CPC .. *H01L 21/76202* (2013.01); *H01L 21/76224* (2013.01); *H01L 21/76243* (2013.01); *H01L 27/10861* (2013.01); *H01L 27/10876* (2013.01)

(58) Field of Classification Search
CPC . H01L 28/10; H01L 23/5227; H01L 27/0288; H01L 27/0629–0635;
(Continued)

(56) References Cited

U.S. PATENT DOCUMENTS 6,235,651 B1  5/2001  Schrems et al.
6,605,493 B1  8/2003  Yu
(Continued)

FOREIGN PATENT DOCUMENTS

CN  105789179 A  7/2016
CN  108389837 A  8/2018
(Continued)

OTHER PUBLICATIONS

Notice of Allowance, dated Jan. 11, 2022, from the Japanese Patent Office for corresponding JP Patent Application No. 2020-003630.
(Continued)

*Primary Examiner* — Julio J Maldonado
*Assistant Examiner* — Stanetta D Isaac
(74) *Attorney, Agent, or Firm* — Muir Patent Law, PLLC

(57) ABSTRACT

A method of manufacturing a semiconductor device, which has buried gate electrodes, includes: forming a plurality of gate trenches in a substrate having a plurality of active regions defined by a device isolation film, the plurality of gate trenches crossing the plurality of active regions and extending parallel to each other in a first horizontal direction; selectively forming a first gate insulating layer on an exposed surface of the substrate; forming a second gate insulating layer on exposed surfaces of both the first gate insulating layer and the device isolation film; and forming a plurality of gate insulating layers by partially removing the first gate insulating layer and the second gate insulating layer, and forming a plurality of buried gate electrodes.

21 Claims, 27 Drawing Sheets

(58) Field of Classification Search
CPC ..... H01L 27/0647–0658; H01L 27/067–0682; H01L 27/0711–0738; H01L 27/0755; H01L 27/0772–0794; H01L 27/0802–0811; H01L 27/1255; H01L 29/0649–0653; H01L 2221/1042–1047; H01L 29/4991; H01L 29/515

See application file for complete search history.

(56) References Cited

U.S. PATENT DOCUMENTS

| | | | |
|---|---|---|---|
| 8,796,126 | B2 | 8/2014 | Taniguchi |
| 9,305,928 | B2 | 4/2016 | Kim et al. |
| 9,472,445 | B2 | 10/2016 | Han et al. |
| 9,559,201 | B2 | 1/2017 | Surthi |
| 9,947,679 | B2 | 4/2018 | Owada et al. |
| 10,037,997 | B1 | 7/2018 | Kang et al. |
| 10,319,726 | B2 | 6/2019 | Nam et al. |
| 2006/0255402 | A1 | 11/2006 | Hshieh et al. |
| 2008/0023757 | A1 | 1/2008 | Kujirai |
| 2011/0306184 | A1 | 12/2011 | Do et al. |
| 2012/0235228 | A1 | 9/2012 | Huang et al. |
| 2014/0061742 | A1 | 3/2014 | Nishitani et al. |
| 2014/0291755 | A1 | 10/2014 | Baek et al. |
| 2015/0228491 | A1 | 8/2015 | Kang |
| 2015/0294975 | A1 | 10/2015 | Nakata |
| 2016/0163641 | A1* | 6/2016 | Bao ............... H01L 21/3065 438/3 |
| 2017/0229565 | A1 | 8/2017 | Jun et al. |
| 2018/0212030 | A1 | 7/2018 | Wu et al. |

FOREIGN PATENT DOCUMENTS

| | | |
|---|---|---|
| JP | 2012069864 A | 4/2012 |
| JP | 2013135029 A | 7/2013 |
| JP | 2014049707 A | 3/2014 |
| KR | 10-2015-0082621 A | 7/2015 |
| WO | 2014077209 A1 | 5/2014 |

OTHER PUBLICATIONS

First Office Action, dated Sep. 21, 2021, for corresponding JP Patent Application No. 2020-003630 (5 pages).

Office Action dated Mar. 30, 2023, from the Korean Intellectual Property Office for corresponding Korean Patent Application No. 10-2019-0010063.

* cited by examiner

C – C'

D – D'

B - B'

C - C'

METHOD OF MANUFACTURING SEMICONDUCTOR DEVICE HAVING BURIED GATE ELECTRODES

CROSS-REFERENCE TO RELATED APPLICATION

This application is a continuation of U.S. patent application Ser. No. 16/540,228, filed Aug. 14, 2019, in the U.S. Patent and Trademark Office, which claims the benefit of priority under 35 U.S.C. § 119 of Korean Patent Application No. 10-2019-0010063, filed on Jan. 25, 2019, in the Korean Intellectual Property Office, the entire disclosures of both of which are incorporated herein.

BACKGROUND

The inventive concept relates to a method of manufacturing a semiconductor device, and more particularly, to a method of manufacturing a semiconductor device having buried gates.

Along with the rapid development of the electronics industry and the demand of users, electronic equipment has been increasingly smaller and lighter. Thus, since highly integrated semiconductor devices used in electronic equipment have been required, the design rules for components of semiconductor devices have been reduced. To manufacture highly scaled semiconductor devices, buried gate electrodes buried in semiconductor substrates have been introduced as gate electrodes.

SUMMARY

The inventive concept provides a semiconductor device and a method of manufacturing a semiconductor device having buried gates and exhibiting improved reliability and performance.

According to an aspect of the inventive concept, there is provided a method of manufacturing a semiconductor device, the method including: forming a plurality of gate trenches in a substrate that has a plurality of active regions defined by a device isolation film, the plurality of gate trenches crossing the plurality of active regions and extending in a first horizontal direction to be parallel to each other; selectively forming a first gate insulating layer on an exposed surface of the substrate; forming a second gate insulating layer on exposed surfaces of both the first gate insulating layer and the device isolation film, the second gate insulating layer having a thickness that is less than a thickness of the first gate insulating layer; forming a plurality of gate insulating layers by partially removing the first gate insulating layer and the second gate insulating layer; and forming a plurality of buried gate electrodes, wherein the plurality of gate insulating layers respectively cover side and bottom surfaces of lower portions of the plurality of gate trenches, and wherein the plurality of buried gate electrodes are respectively arranged on the plurality of gate insulating layers to fill the lower portions of the plurality of gate trenches.

According to another aspect of the inventive concept, there is provided a method of manufacturing a semiconductor device, the method including: forming a plurality of gate trenches in a substrate that has a plurality of active regions defined by a device isolation film, the plurality of gate trenches crossing the plurality of active regions and extending in a first horizontal direction to be parallel to each other; forming a first gate insulating layer on an exposed surface of the substrate by a first oxidation process; forming a second gate insulating layer by a second oxidation process, the second gate insulating layer conformally covering the first gate insulating layer and the device isolation film; and forming a plurality of buried gate electrodes to respectively fill lower portions of the plurality of gate trenches, wherein the first oxidation process includes an in-situ steam generated (ISSG) oxidation process performed in an $O_2+H_2$ atmosphere and the second oxidation process includes a deposition process.

According to yet another aspect of the inventive concept, there is provided a method of manufacturing a semiconductor device, the method including: forming a plurality of gate trenches in a substrate that has a plurality of active regions defined by a device isolation film, the plurality of gate trenches crossing the plurality of active regions and extending in a first horizontal direction to be parallel to each other; forming a plurality of gate insulating layers each including a portion of a first gate insulating layer and a portion of a second gate insulating layer, the first gate insulating layer being selectively formed on an exposed surface of the substrate, and the second gate insulating layer being formed on exposed surfaces of both the first gate insulating layer and the device isolation film and having a thickness that is less than a thickness of the first gate insulating layer; and forming a plurality of buried gate electrodes, which extend parallel to each other in the first horizontal direction and respectively fill lower portions of the plurality of gate trenches with the plurality of gate insulating layers therebetween, wherein each of the plurality of buried gate electrodes has a maximum width in a second horizontal direction perpendicular to the first horizontal direction in a portion thereof having two opposite sides, on which the device isolation film is arranged, and has a minimum width in the second horizontal direction in a portion thereof having two opposite sides, on which cross-sections of each of the plurality of active regions crossed by the plurality of gate trenches are respectively arranged.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

FIGS. 1 to 12B are diagrams respectively illustrating sequential processes of a method of manufacturing a semiconductor device, according to an example embodiment.

Figure 1:
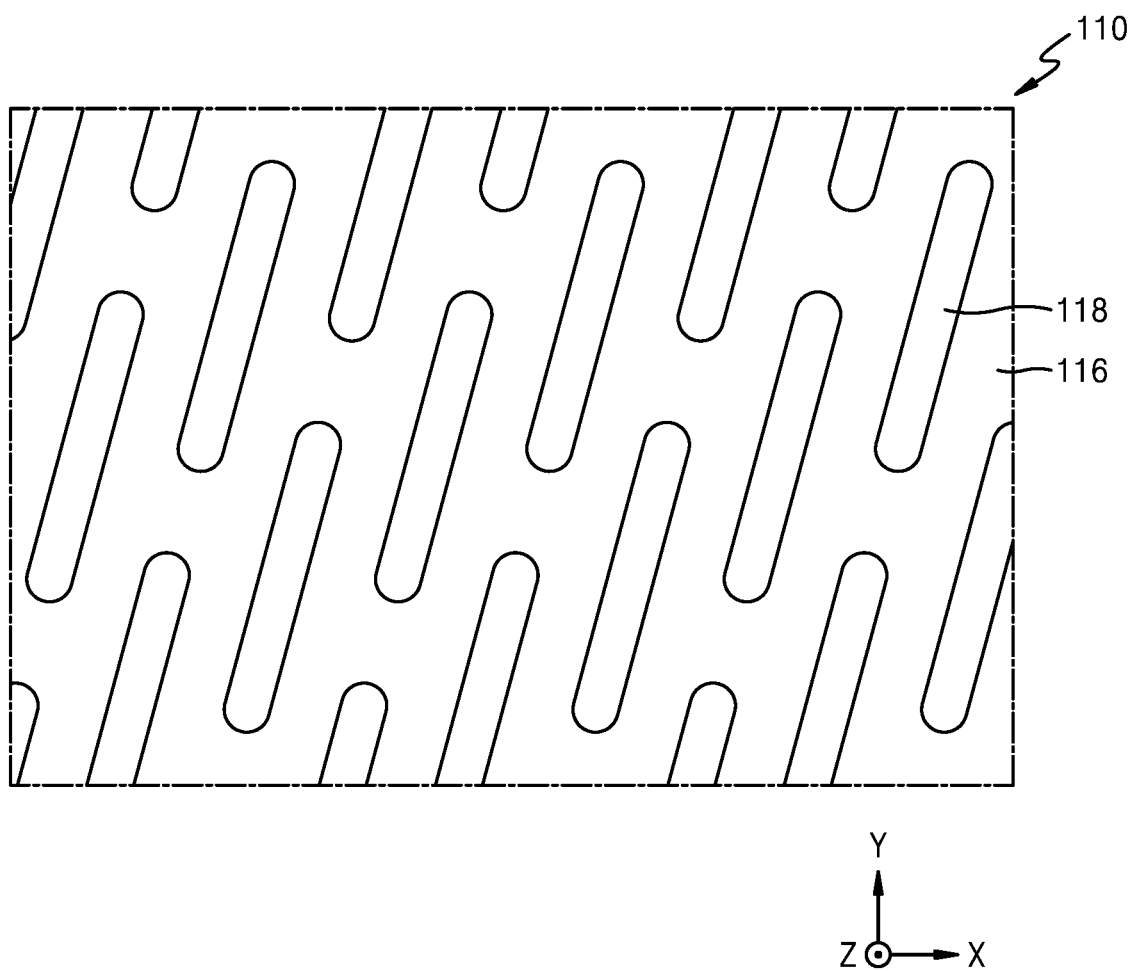
FIGS. 1, 2, 3A-3D, 4, 5A-5C, 6, 7A-7C, 8, 9A-9C, 10, 11A-11C, and 12A-12B are diagrams respectively illustrating sequential processes of a method of manufacturing a semiconductor device, according to an example embodiment.

FIG. 1 is a plan view illustrating a process of forming an active region in a semiconductor substrate, according to an example embodiment.

Referring to FIG. 1, a device isolation film 116 is formed in a substrate 110, and a plurality of active regions 118 are defined by the device isolation film 116. Each of the plurality of active regions 118 may have a relatively long island shape having a short axis and a long axis. For example, each of the plurality of active regions 118 may have a short axis and a long axis in oblique directions with respect to a first horizontal axis (X direction) and a second horizontal axis (Y direction).

The substrate 110 may include, for example, silicon (Si), for example, crystalline Si, polycrystalline Si, or amorphous Si. Alternatively, the substrate 110 may include a semiconductor element, such as germanium (Ge), or a compound semiconductor, such as silicon carbide (SiC), gallium arsenide (GaAs), indium arsenide (InAs), or indium phosphide (InP). Alternatively, the substrate 110 may have a silicon-on-insulator (SOI) structure. For example, the substrate 110 may include a buried oxide (BOX) layer. The substrate 110 may include a conductive region, for example, an impurity-doped well or an impurity-doped structure.

The device isolation film 116 may include a material including at least one selected from the group consisting of a silicon oxide film, a silicon nitride film, and a silicon oxynitride film. The device isolation film 116 may include a single layer including one insulating film, a double layer including two insulating films, or a multilayer including a combination of at least three insulating films. For example, the device isolation film 116 may include two insulating films that are different from each other. For example, the device isolation film 116 may include a silicon oxide film and a silicon nitride film. For example, the device isolation film 116 may include a triple layer including a silicon oxide film, a silicon nitride film, and a silicon oxide film.

Figure 2:
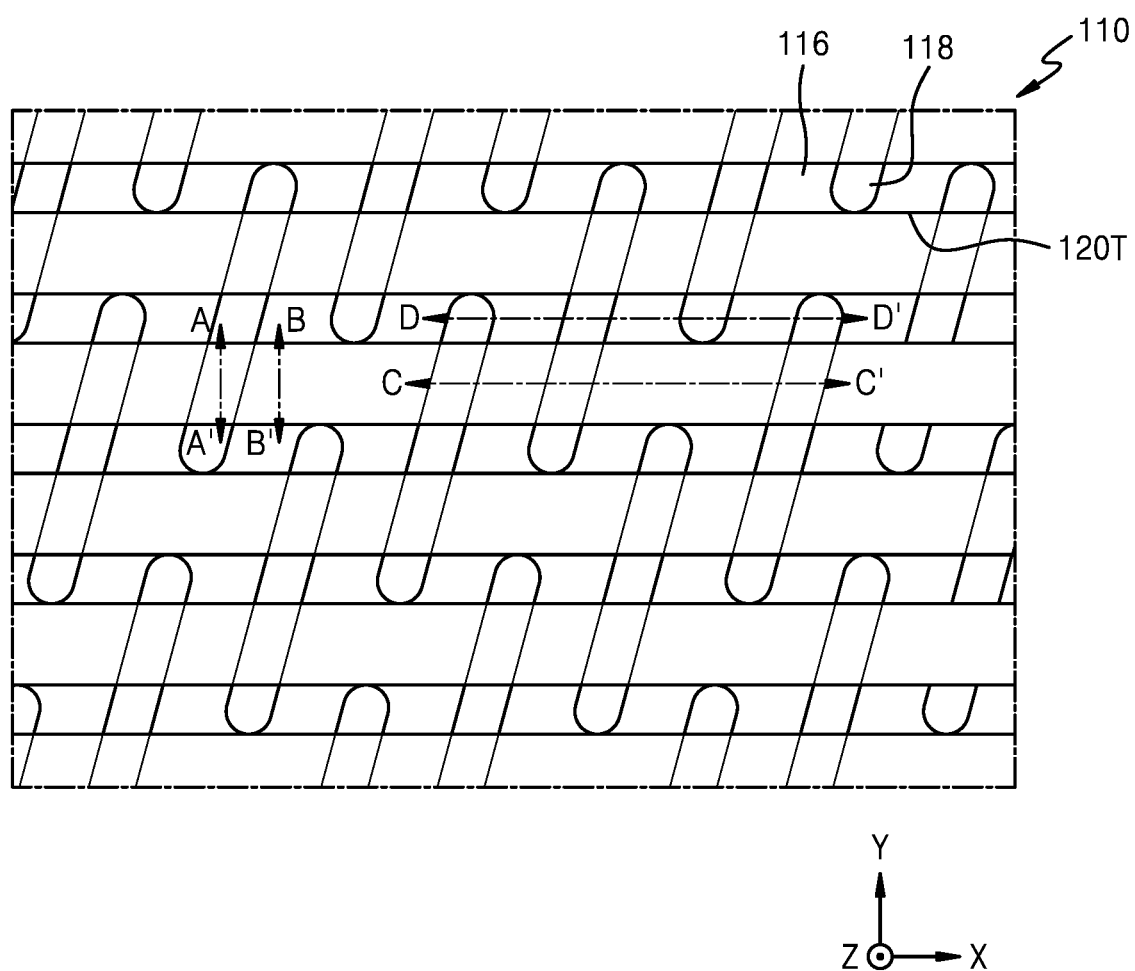

FIG. 2 is a plan view illustrating a process of forming a gate trench, according to an example embodiment, and FIGS. 3A to 3D are cross-sectional views taken along lines A-A', B-B', C-C', and D-D' of FIG. 2, respectively.

Figure 3A:
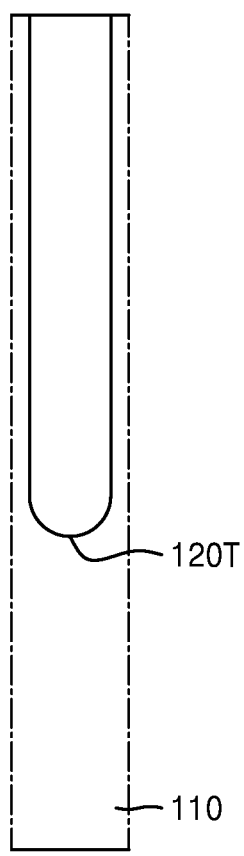
Figure 3A:
Figure 3B:
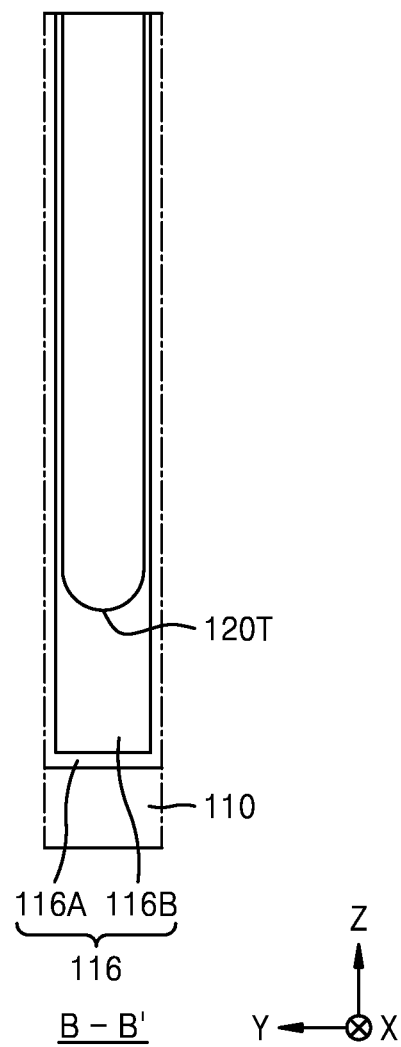
Figure 3C:
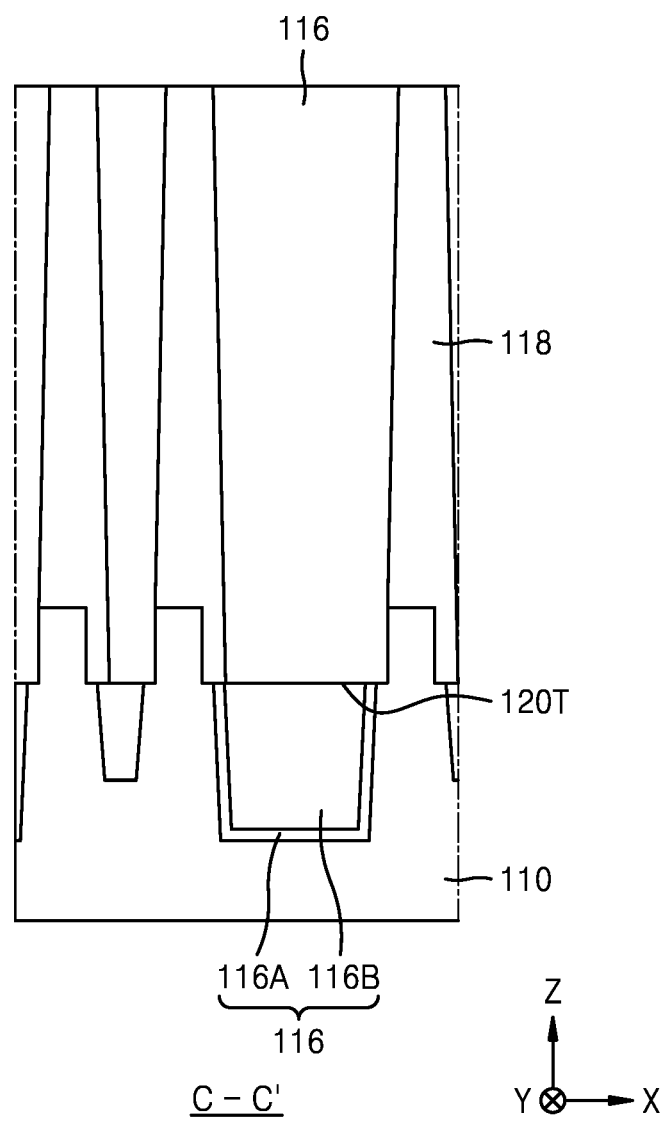
Figure 3D:
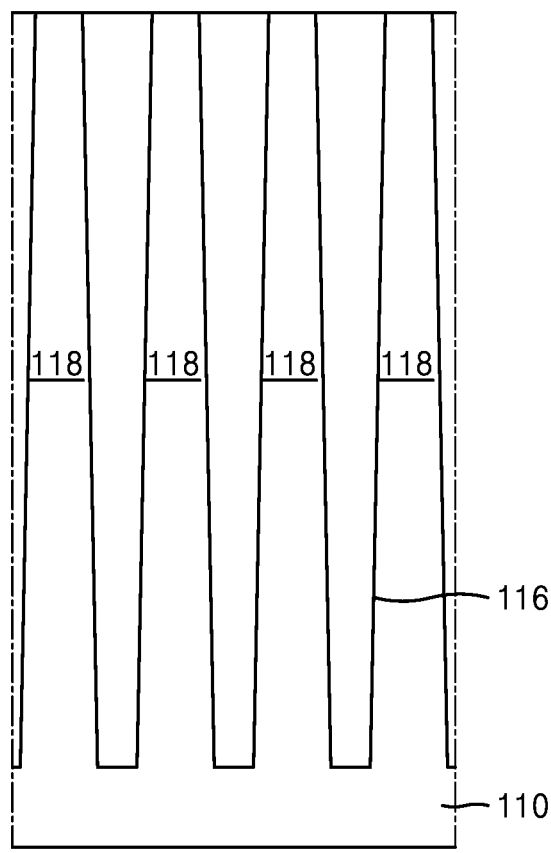

Referring to FIGS. 2 to 3D, a plurality of gate trenches 120T are formed in the substrate 110. The plurality of gate trenches 120T may respectively have linear shapes extending parallel to each other across the plurality of active regions 118. A portion of each of the plurality of active regions 118 may be exposed at a side surface of each gate trench 120T crossing the plurality of active regions 118. An exposed surface of each active region 118 crossed by each gate trench 120T may be referred to as a cross-section of the active region 118.

For example, the plurality of gate trenches 120T may extend in the first horizontal direction (X direction) and may be arranged at substantially equal intervals in the second horizontal direction (Y direction). In some embodiments, each of the plurality of gate trenches 120T may have the same width in the second horizontal direction (Y direction).

Terms such as "same," "equal." "planar," or "coplanar." as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same." "substantially equal," or "substantially planar," may be exactly the same, equal, or planar, or may be the same, equal, or planar within acceptable variations that may occur, for example, due to manufacturing processes.

In some embodiments, a pair of gate trenches 120T adjacent to each other may cross one active region 118. In some other embodiments, long-axis ends of at least some of the plurality of active regions 118 may be exposed at the side surface of each of the plurality of gate trenches 120T, without being limited thereto, and long-axis ends of any or at least some of the plurality of active regions 118 may not be exposed at the side surface of each of the plurality of gate trenches 120T.

In some embodiments, the device isolation film 116 and the substrate 110 may be etched respectively by separate etching processes such that a step is formed at a bottom surface of each of the plurality of gate trenches 120T, whereby an etch depth of the device isolation film 116 may be different from an etch depth of the substrate 110. For example, the bottom surface of each of the plurality of gate trenches 120T may be lower in the device isolation film 116 than in the substrate 110.

In some embodiments, the device isolation film 116 may include a first device isolation film 116A and a second device isolation film 116B. The first device isolation film 116A and the second device isolation film 116B may respectively include materials different from each other. For example, the first device isolation film 116A may include an oxide film and the second device isolation film 116B may include a nitride film. However, according to the inventive concept, a configuration of the device isolation film 116 is not limited to the above description.

Figure 4:
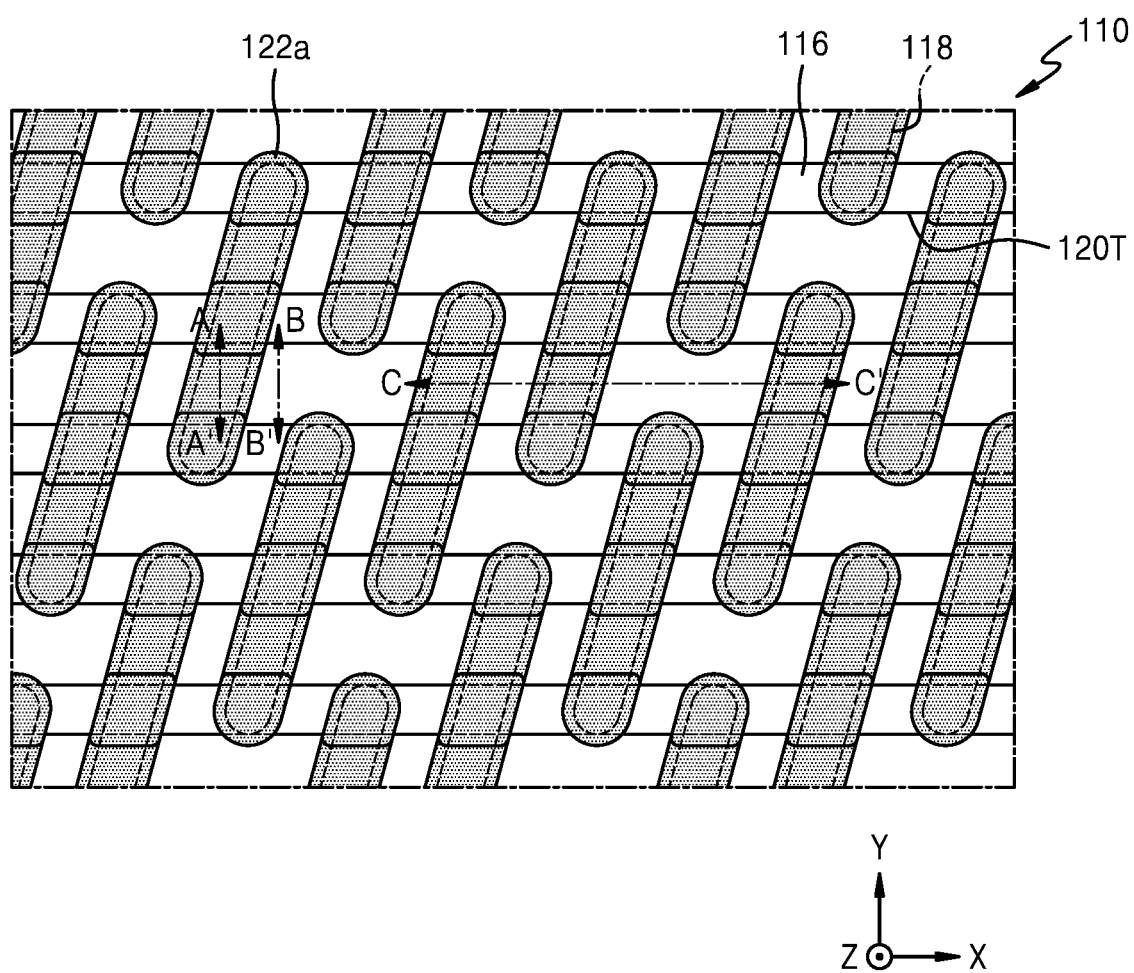
Figure 5A:
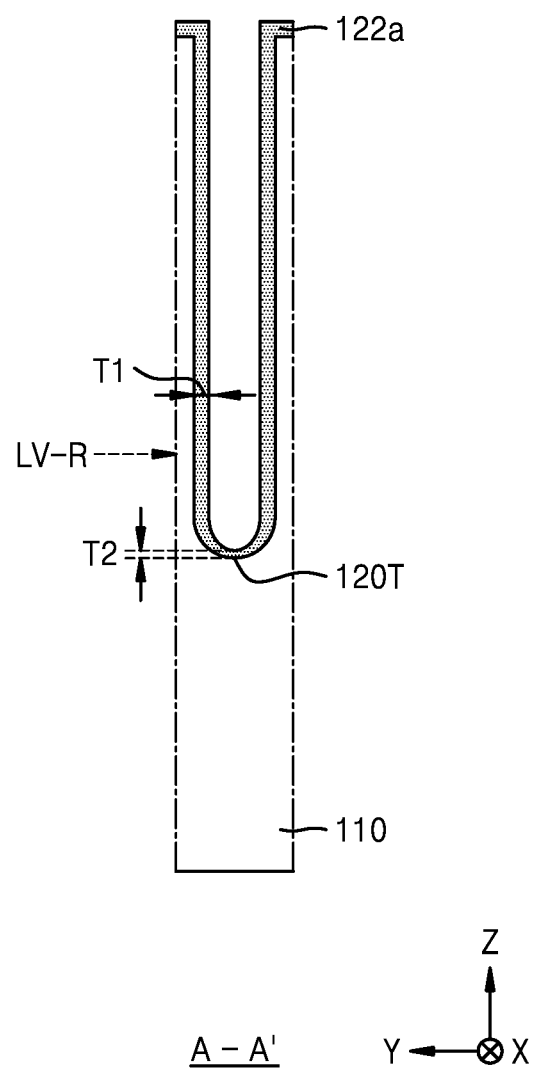
Figure 5B:
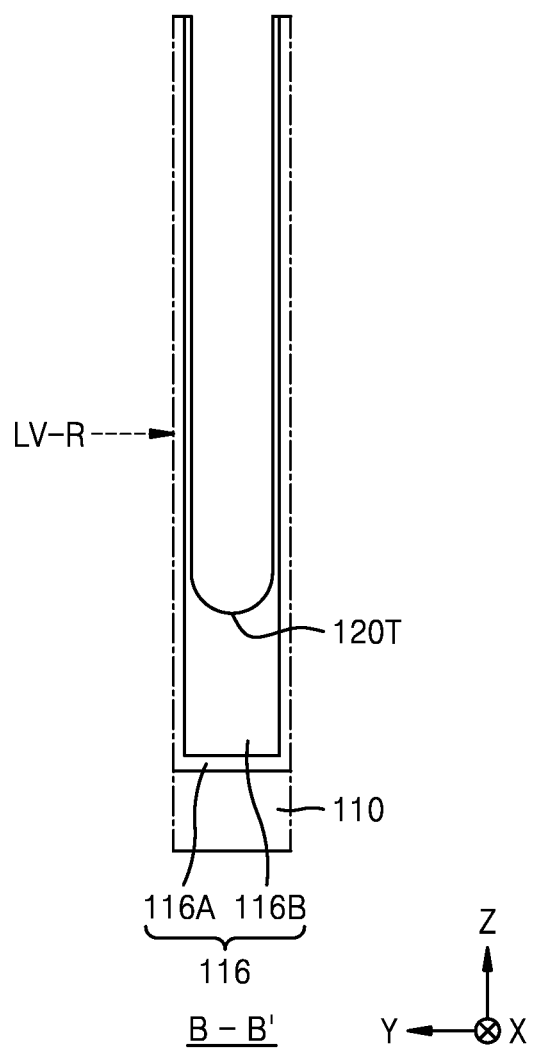
Figure 5C:
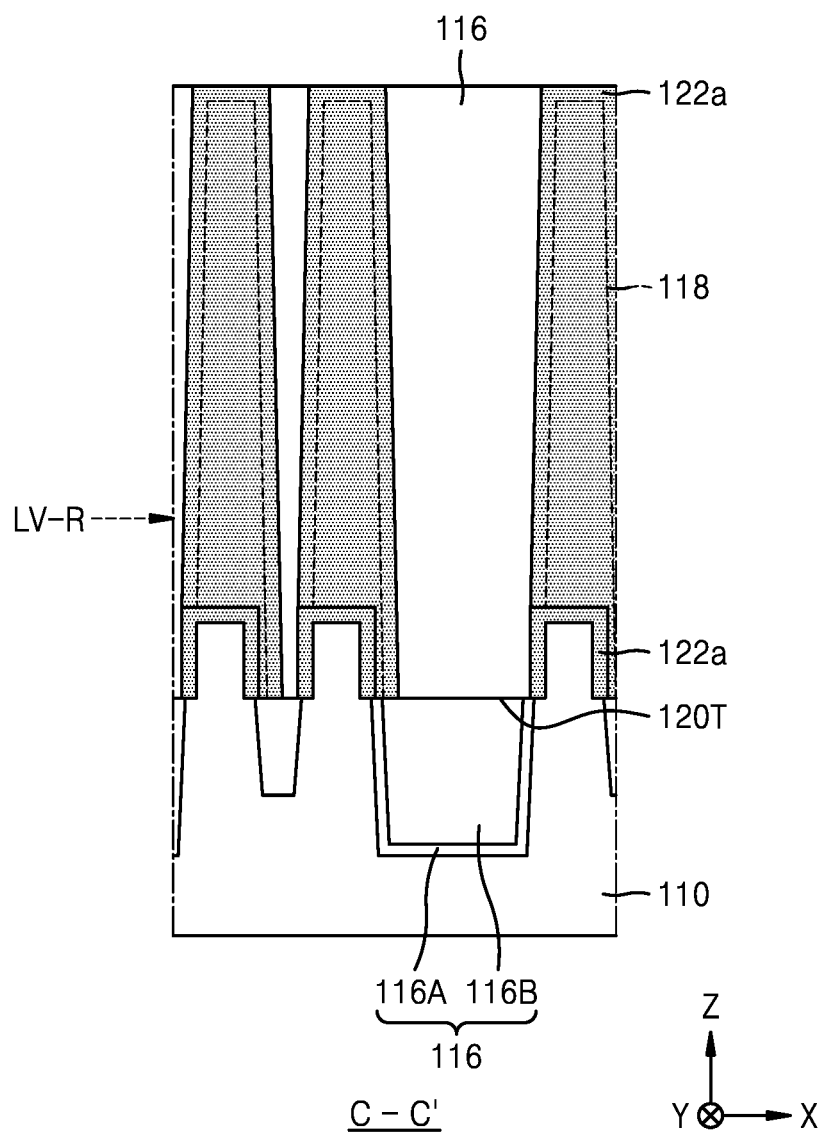
Figure 6:
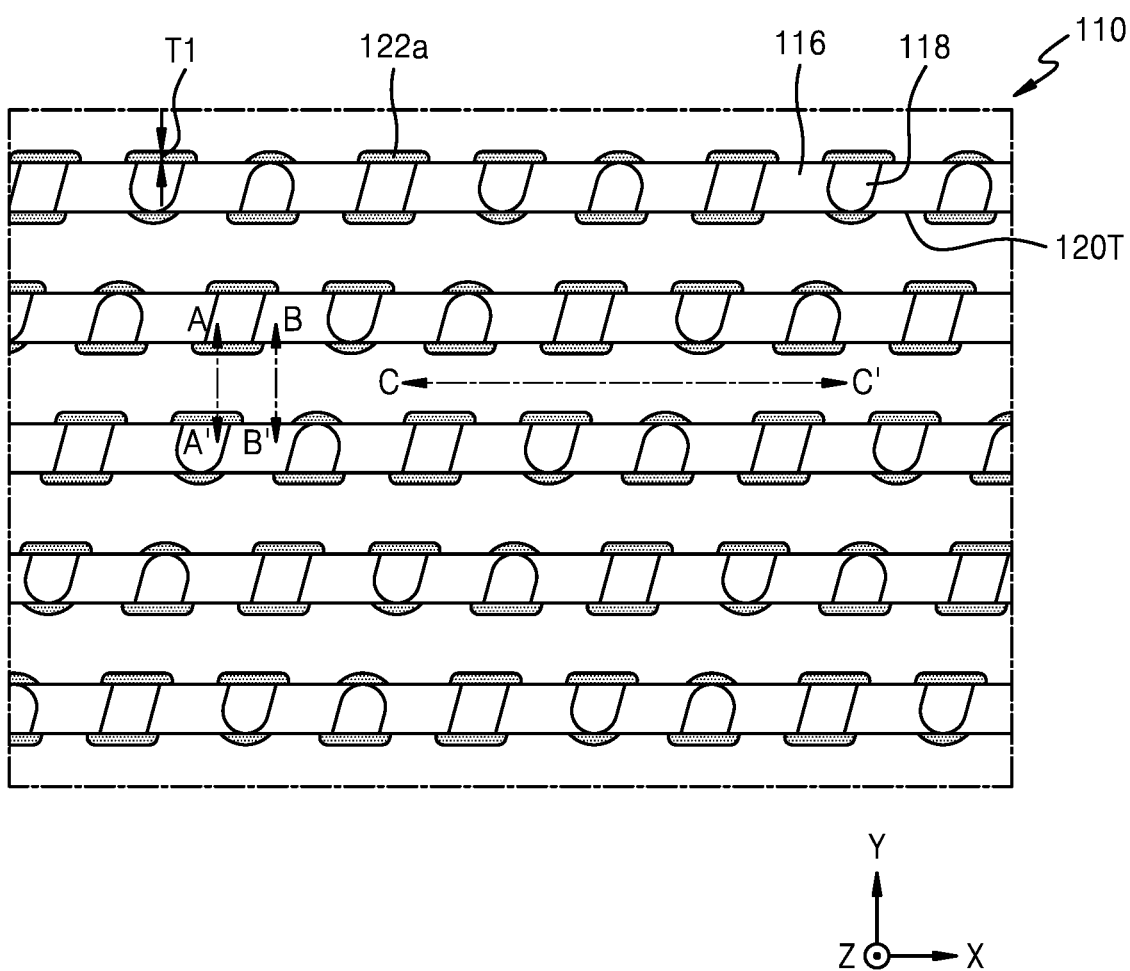

FIG. 4 is a plan view illustrating a process of forming a first gate insulating layer, according to an example embodiment, and FIGS. 5A to 5C are cross-sectional views taken along lines A-A', B-B', and C-C' of FIG. 4, respectively. FIG. 6 is a cross-sectional view taken in a direction parallel to a main surface of the substrate 110 along a reference level LV-R shown in FIG. 5C, and the reference level LV-R refers to a level corresponding to a buried gate electrode 120 shown in FIGS. 11A to 12B. FIG. 6 may illustrate only shapes at the reference level LV-R and may not illustrate shapes at levels other than the reference level LV-R, for example, shapes at a level of a bottom surface of a gate trench 120T.

As used herein, the term "level" refers to a height in a vertical direction (Z direction) from the main surface of the substrate 110.

Referring to FIGS. 4 to 6, a first gate insulating layer 122a is formed on an active region 118. The first gate insulating layer 122a may include, for example, at least one selected from the group consisting of a silicon oxide film, a silicon nitride film, a silicon oxynitride film, oxide/nitride/oxide (ONO), and a high-k dielectric film having a higher dielectric constant than a silicon oxide film.

The first gate insulating layer 122a may be formed by a first process. The first gate insulating layer 122a may be selectively grown on an exposed surface of the substrate 110 including the active region 118. For example, the first process may include a thermal oxidation process. The first process may also be referred to as a first oxidation process. In some embodiments, the first oxidation process may include an in-situ steam generated (ISSG) oxidation process performed in an atmosphere of $O_2+H_2$.

Although the first gate insulating layer 122a is conformally formed overall, the thickness of the first gate insulating layer 122a on a side surface of the gate trench 120T may be different from the thickness thereof on the bottom surface of the gate trench 120T.

For example, when the first gate insulating layer 122a is formed by an ISSG oxidation process, the first gate insulating layer 122a may be formed at a substantially equal growth rate on both the side surface and the bottom surface of the gate trench 120T in an initial stage in which the thickness of the first gate insulating layer 122a on the substrate 110 is relatively low, and the growth rate of the first gate insulating layer 122a on the side surface of the gate trench 120T may be greater than the growth rate thereof on the bottom surface of the gate trench 120T with increasing thickness of the first gate insulating layer 122a on the substrate 110.

In this case, a first thickness T1 of a portion of the first gate insulating layer 122a, which is formed on the side surface of the gate trench 120T, may be greater than a second thickness T2 of a portion of the first gate insulating layer 122a, which is formed on the bottom surface of the gate trench 120T. Therefore, the step coverage of the first gate insulating layer 122a may deteriorate with increasing thickness thereof, the step coverage of the first gate insulating layer 122a denoting a ratio of the thickness of the portion of the first gate insulating layer 122a on the bottom surface of the gate trench 120T with respect to the thickness of the portion of the first gate insulating layer 122a on the side surface of the gate trench 120T.

In some embodiments, the first thickness T1 of the first gate insulating layer 122a may be approximately equal to or less than 1.5 times the second thickness T2 thereof (e.g., T1≤1.5*T2). For example, when the width of the gate trench 120T in the second horizontal direction (Y direction) is tens of nanometers, the first thickness T1 of the first gate insulating layer 122a may range from about 45 Å to about 75 Å and the second thickness T2 thereof may range from about 30 Å to about 50 Å.

Since the first gate insulating layer 122a may be selectively formed on the substrate 110 including the active region 118, the gate trench 120T may have a width reduced due to the first gate insulating layer 122a, in a portion thereof having a side surface at which the active region 118 is exposed, that is, in a portion thereof having a side surface at which the cross-section of the active region 118 is exposed.

Figure 7A:
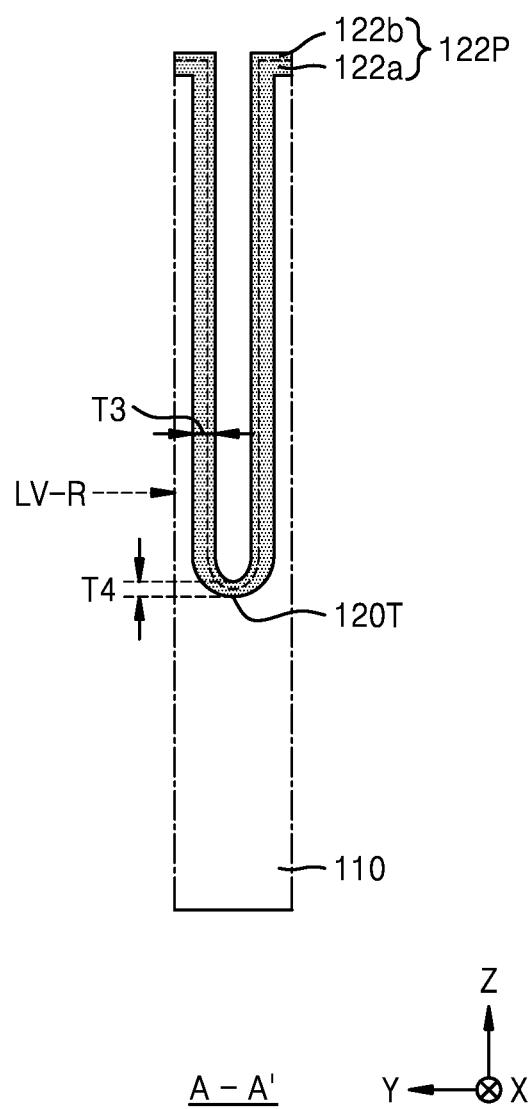
Figure 7B:
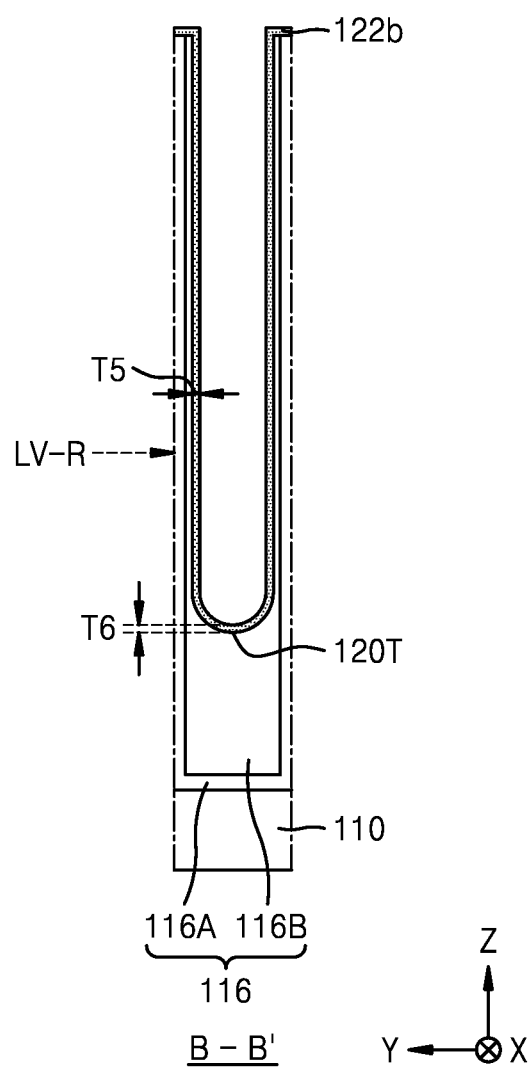
Figure 7C:
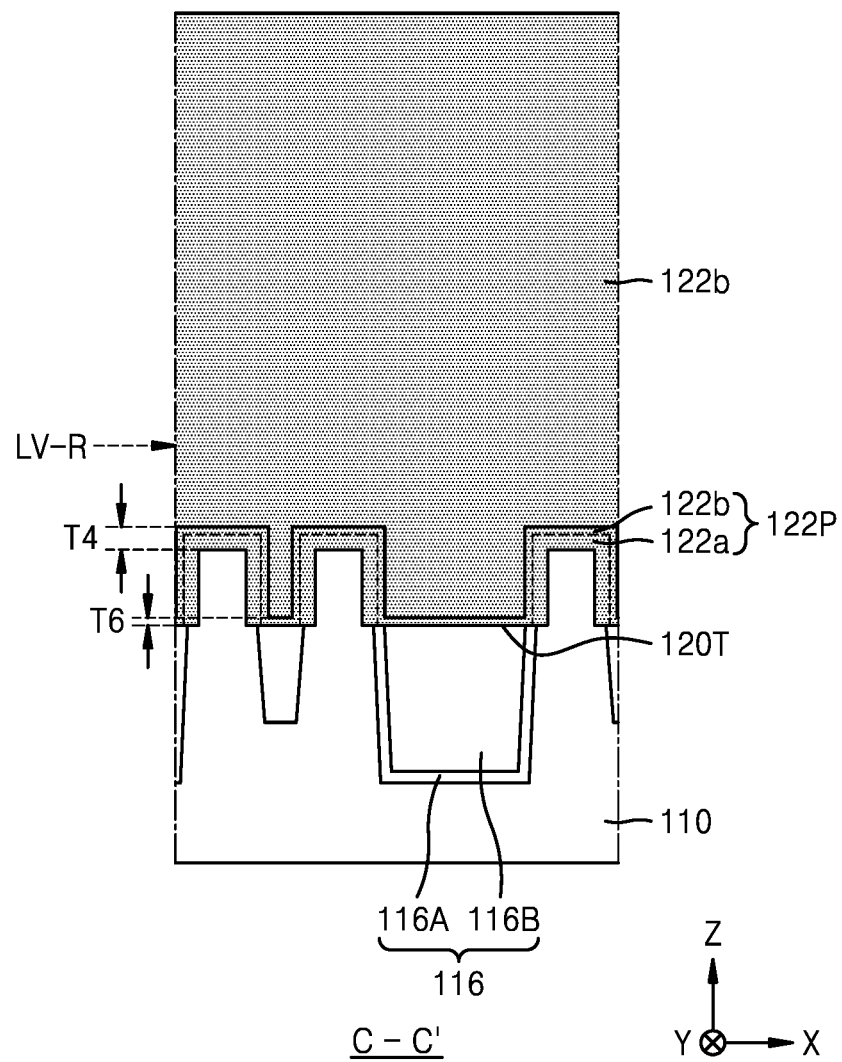
Figure 8:
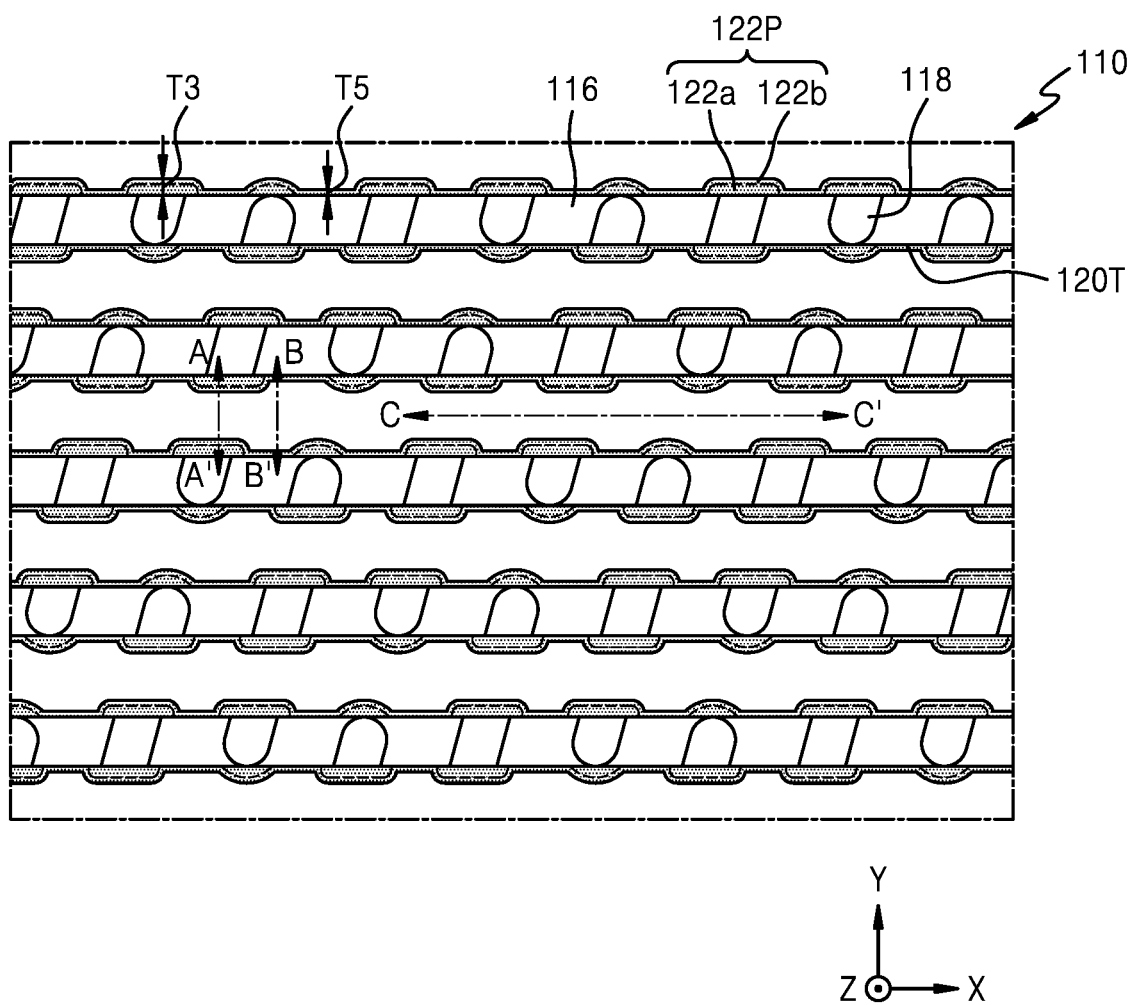

FIGS. 7A to 8 are cross-sectional views illustrating a process of forming a second gate insulating layer, according to an example embodiment, and in particular, FIGS. 7A to 7C are cross-sectional views taken along lines A-A', B-B', and C-C' of FIG. 8, respectively, and FIG. 8 is a cross-sectional view taken in the direction parallel to the main surface of the substrate 110 along the reference level LV-R shown in FIGS. 7A to 7C. FIG. 8 may illustrate only shapes at the reference level LV-R and may not illustrate shapes at levels other than the reference level LV-R, for example, shapes at the level of the bottom surface of the gate trench 120T.

Referring to FIGS. 7A to 8, a second gate insulating layer 122b is formed on exposed surfaces of both the first gate insulating layer 122a and the device isolation film 116. The second gate insulating layer 122b may include at least one selected from the group consisting of a silicon oxide film, a silicon nitride film, a silicon oxynitride film, ONO, and a high-k dielectric film having a higher dielectric constant than a silicon oxide film. In some embodiments, the first gate insulating layer 122a may include the same material as that of the second gate insulating layer 122b. In some other embodiments, the first gate insulating layer 122a and the second gate insulating layer 122b may respectively include materials different from each other.

For example, the second gate insulating layer 122b may have a dielectric constant of about 10 to about 25. In some embodiments, the second gate insulating layer 122b may include at least one selected from the group consisting of hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the second gate insulating layer 122b may include $HfO_2$, $Al_2O_3$, $HfAlO_3$, $Ta_2O_3$, or $TiO_2$.

The second gate insulating layer 122b may be conformally formed such that the thickness thereof on the side surface of the gate trench 120T is substantially equal to the thickness thereof on the bottom surface of the gate trench 120T. In addition, the second gate insulating layer 122b may also be formed such that the thickness thereof on the first gate insulating layer 122a is substantially equal to the thickness thereof on the device isolation film 116. The thickness of the second gate insulating layer 122b may be less than that of the first gate insulating layer 122a.

The second gate insulating layer 122b may cover both the first gate insulating layer 122a and the device isolation film 116. The second gate insulating layer 122b may be formed by a second process. The second process may include a deposition process. The second process may also be referred to as a second oxidation process. For example, the second process may include an atomic layer deposition (ALD) process.

The first gate insulating layer 122a and the second gate insulating layer 122b, together, may constitute a gate insulating structure 122P. In some embodiments, when the first gate insulating layer 122a includes the same material as that of the second gate insulating layer 122b, an interface between the first gate insulating layer 122a and the second gate insulating layer 122b may not be observed and the gate insulating structure 122P may be observed as a single layer. In some other embodiments, when the first gate insulating layer 122a and the second gate insulating layer 122b respectively include different materials from each other, an interface between the first gate insulating layer 122a and the second gate insulating layer 122b may be observed.

The thickness of a portion of the gate insulating structure 122P, which is formed on the substrate 110, may be different from the thickness of a portion of the gate insulating structure 122P, which is formed on the device isolation film 16. For example, the thickness of the portion of the gate insulating structure 122P, which is formed on the substrate 110, may be greater than the thickness of the portion of the gate insulating structure 122P, which is formed on the device isolation film 116.

A third thickness T3 of a portion of the gate insulating structure 122P, which is formed on the substrate 110 corresponding to the side surface of the gate trench 120T, may be different from a fourth thickness T4 of a portion of the gate insulating structure 122P, which is formed on the substrate 110 corresponding to the bottom surface of the gate trench 120T. For example, the third thickness T3 of the portion of the gate insulating structure 122P, which is formed on the substrate 110 corresponding to the side surface of the gate trench 120T, may be greater than the fourth thickness T4 of the portion of the gate insulating structure 122P, which is formed on the substrate 110 corresponding to the bottom surface of the gate trench 120T.

The gate insulating structure 122P may include the first gate insulating layer 122a and the second gate insulating layer 122b on the first gate insulating layer 122a, the first gate insulating layer 122a may be selectively formed only on the substrate 110, and the second gate insulating layer 122b may be formed on both the first gate insulating layer 122a and the device isolation film 116.

The portion of the gate insulating structure 122P, which is formed on the substrate 110, may include a stack structure of the first gate insulating layer 122a and the second gate insulating layer 122b, and the portion of the gate insulating structure 122P, which is formed on the device isolation film 116, may include a single structure of the second gate insulating layer 122b.

A fifth thickness T5 of a portion of the gate insulating structure 122P, which is formed on the device isolation film 116 corresponding to the side surface of the gate trench 120T, may be substantially equal to a sixth thickness T6 of a portion of the gate insulating structure 122P, which is formed on the device isolation film 116 corresponding to the bottom surface of the gate trench 120T. Therefore, the fifth thickness T5 of the gate insulating structure 122P may be the thickness of a portion of the second gate insulating layer 122b, which is formed on the device isolation film 116 corresponding to the side surface of the gate trench 120T, and the sixth thickness T6 of the gate insulating structure 122P may be the thickness of a portion of the second gate insulating layer 122b, which is formed on the device isolation film 116 corresponding to the bottom surface of the gate trench 120T. For example, each of the fifth thickness T5 and the sixth thickness T6 of the gate insulating structure 122P may range from about 15 Å to about 30 Å.

Since the thickness of the second gate insulating layer 122b may be less than the thickness of the first gate insulating layer 122a and the third thickness T3 of the gate insulating structure 122P is a sum of the first thickness T1 of the first gate insulating layer 122a and the fifth thickness T5 of the second gate insulating layer 122b, the fifth thickness T5 of the gate insulating structure 122P may be less than ½ of the third thickness T3 of the gate insulating structure 122P. For example, when the first thickness T1 of the first gate insulating layer 122a is 60 Å and the fifth thickness T5 of the second gate insulating layer 122b is 20 Å, the third thickness T3 of the gate insulating structure 122P is 80 Å and thus may be about 4 times the fifth thickness T5 of the gate insulating structure 122P.

The third thickness T3 of the portion of the gate insulating structure 122P, which is formed on the substrate 110 corresponding to the side surface of the gate trench 120T, may be substantially equal to a sum of the first thickness T1 (FIG. 5A) of the first gate insulating layer 122a and the fifth thickness T5 of the second gate insulating layer 122b, and the fourth thickness T4 of the portion of the gate insulating structure 122P, which is formed on the substrate 110 corresponding to the bottom surface of the gate trench 120T, may be substantially equal to a sum of the second thickness T2 (FIG. 5A) of the first gate insulating layer 122a and the sixth thickness T6 of the second gate insulating layer 122b.

In some embodiments, the fourth thickness T4 of the gate insulating structure 122P may be equal to or greater than 75% of the third thickness T3 thereof and be less than the third thickness T3 thereof.

When the first gate insulating layer 122a is formed by the first oxidation process (e.g., a thermal oxidation process), and the second gate insulating layer 122b is formed by the second oxidation process (e.g., a deposition process), the first gate insulating layer 122a may have relatively denser film quality than the second gate insulating layer 122b. The first gate insulating layer 122a may have good step coverage in an initial formation stage, in which the first gate insulating layer 122a has a relatively low thickness, and then, may have deteriorated step coverage with increasing thickness thereof.

Before forming the first gate insulating layer 122a, when another oxide film (e.g., the second gate insulating layer 122b by a deposition method) is formed first on the substrate 110, even in the initial formation stage in which the first gate insulating layer 122a has a relatively low thickness, since the first gate insulating layer 122a may be affected by the thickness of the already-formed second gate insulating layer 122b, the first gate insulating layer 122a may have poor step coverage similarly to the case where the first gate insulating layer 122a has a relatively high thickness.

However, before forming the first gate insulating layer 122a, when another oxide film is not formed on the substrate 110, the first gate insulating layer 122a may be formed with relatively good step coverage by appropriately adjusting the thickness of the first gate insulating layer 122a. Next, the second gate insulating layer 122b may be formed on the first gate insulating layer 122a such that the thickness of the second gate insulating layer 122b is less than the thickness of the first gate insulating layer 122a, whereby the gate insulating structure 122P including the first gate insulating layer 122a and the second gate insulating layer 122b may be formed with relatively good step coverage and relatively good film quality.

Figure 9A:
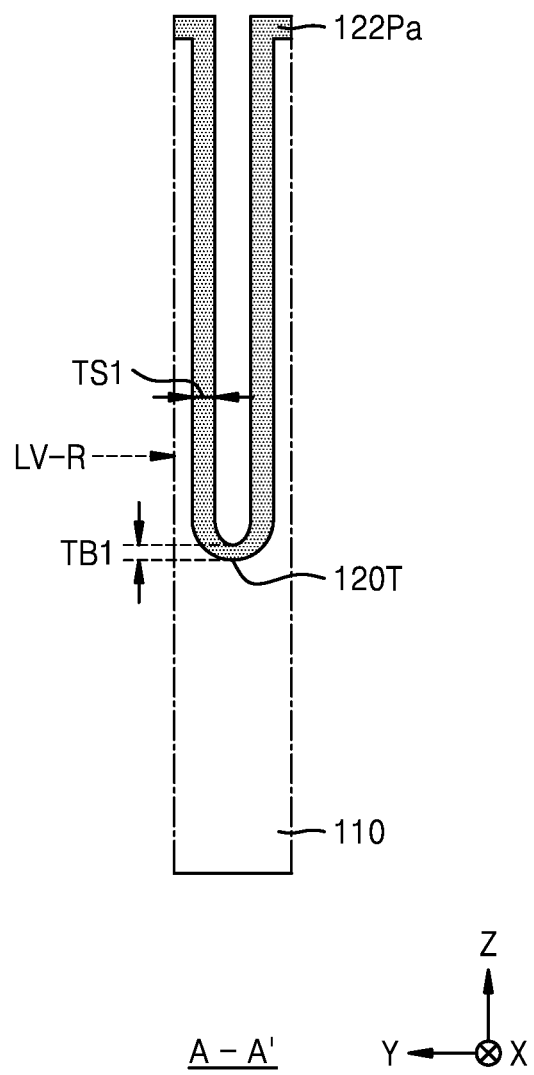
Figure 9B:
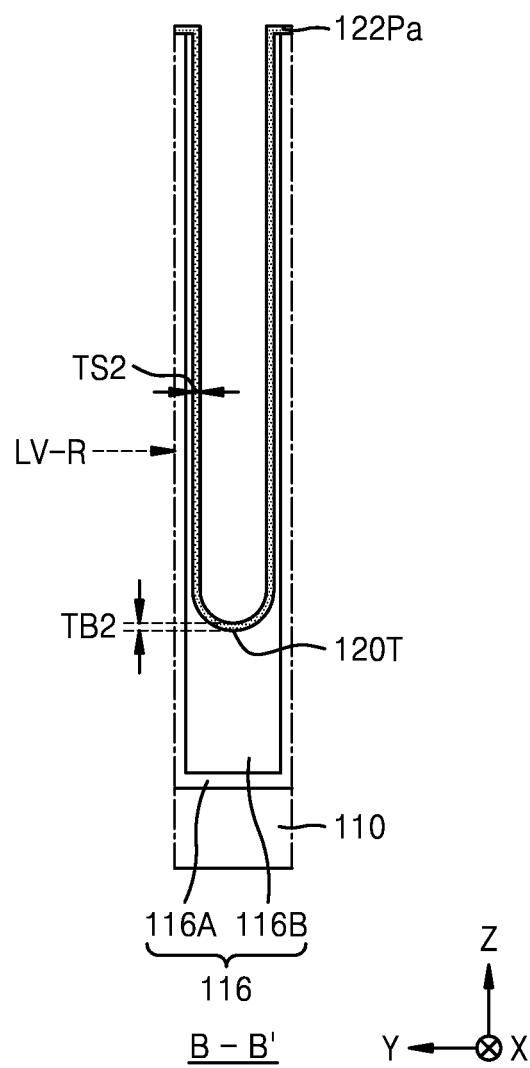
Figure 9C:
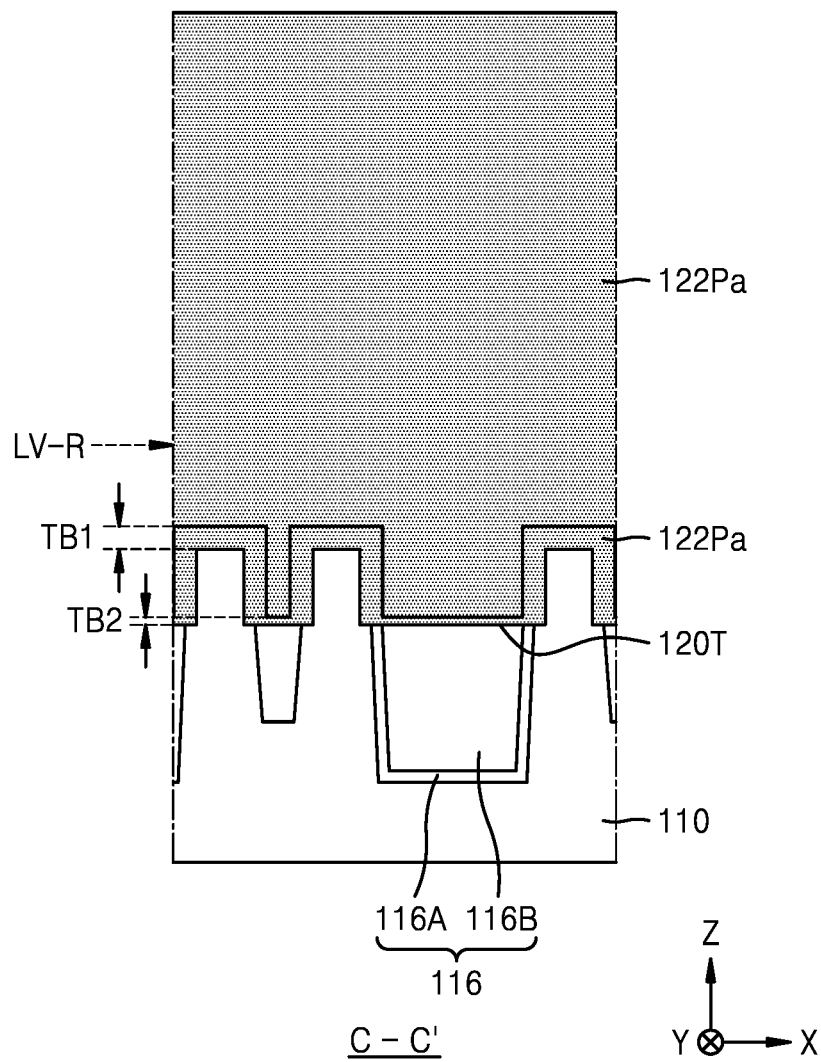
Figure 10:
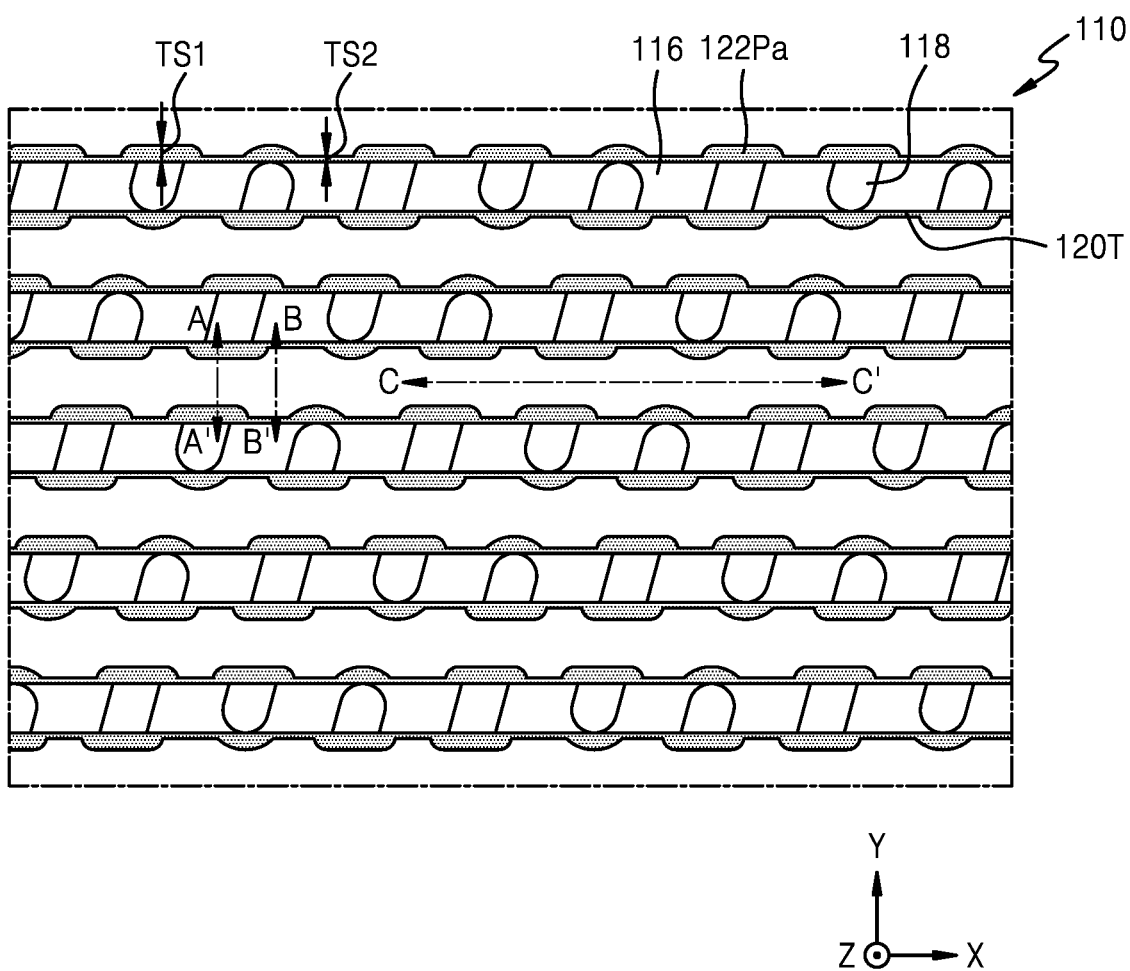

FIGS. 9A to 10 are cross-sectional views illustrating a process of forming a preliminary gate insulating layer, according to an example embodiment, and in particular. FIGS. 9A to 9C are cross-sectional views taken along lines A-A', B-B', and C-C' of FIG. 10, respectively, and FIG. 10 is a cross-sectional view taken in the direction parallel to the main surface of the substrate 110 along the reference level LV-R shown in FIGS. 9A to 9C. FIG. 10 may illustrate only shapes at the reference level LV-R and may not illustrate shapes at levels other than the reference level LV-R, for example, shapes at the level of the bottom surface of the gate trench 120T.

Referring to FIGS. 9A to 10, a preliminary gate insulating layer 122Pa is formed from the gate insulating structure 122P including the first gate insulating layer 122a and the second gate insulating layer 122b, which are shown in FIGS. 7A to 8.

In some embodiments, the preliminary gate insulating layer 122Pa may be formed by a third process. For example, the third process may include a thermal oxidation process and may also be referred to as a third oxidation process. In some embodiments, the third oxidation process may include an ISSG oxidation process performed in an $O_2+H_2$ atmosphere, or an ISSG oxidation process performed in an atmosphere changing from an $O_2+H_2$ atmosphere to an $O_2$ atmosphere. In some other embodiments, the third oxidation process may include a dry oxidation process.

In some embodiments, when the third oxidation process includes an ISSG oxidation process performed in an atmosphere changing from an $O_2+H_2$ atmosphere to an $O_2$ atmosphere, in a process time of the third oxidation process, a time period of the $O_2+H_2$ atmosphere may be less than a time period of the $O_2$ atmosphere. For example, in the process time of the third oxidation process, a time period for which $H_2$ is present in the atmosphere may be relatively short.

In some embodiments, the process time of the third oxidation process may be less than a process time of the first oxidation process described with reference to FIGS. 4 to 6. As used herein, the process time refers to a time period for which a process temperature and a process atmosphere for performing each of the first and third oxidation processes are maintained, and the process time does not include a ramp up time and a cool down time.

In some embodiments, when the first oxidation process includes an ISSG oxidation process performed in an $O_2+H_2$ atmosphere and the third oxidation process includes an ISSG oxidation process performed in an $O_2+H_2$ atmosphere or an atmosphere changing from an $O_2+H_2$ atmosphere to an $O_2$ atmosphere, a time period of the $O_2+H_2$ atmosphere in a process time of the third oxidation process may be less than a time period of the $O_2+Hz$ atmosphere in a process time of the first oxidation process.

In some other embodiments, the third process may include a heat treatment process. For example, the heat treatment process may be performed by a rapid thermal processing (RTP) method or an annealing method.

The third process may remove impurities included in the gate insulating structure 122P, may make the gate insulating structure 122P denser in terms of film quality, may heal interfacial defects between the gate insulating structure 122P and the substrate 110, and/or may heal defects between the first gate insulating layer 122a and the second gate insulating layer 122b. For example, the preliminary gate insulating layer 122Pa may be a resulting product obtained by removing impurities from the gate insulating structure 122P, making the gate insulating structure 122P denser in terms of film quality, and/or healing the interfacial defects between the gate insulating structure 122P and the substrate 110, the gate insulating structure 122P including the first gate insulating layer 122a and the second gate insulating layer 122b.

In some yet other embodiments, the third process may not be performed separately, and the gate insulating structure 122P including the first gate insulating layer 122a and the second gate insulating layer 122b, which are shown in FIGS. 7A to 8, may function as the preliminary gate insulating layer 122Pa.

A first side thickness TS1 of a portion of the preliminary gate insulating layer 122Pa, which is formed on the substrate 110 corresponding to the side surface of the gate trench 120T, may be different from a first bottom thickness TB1 of a portion of the preliminary gate insulating layer 122Pa, which is formed on the substrate 110 corresponding to the bottom surface of the gate trench 120T. For example, the first side thickness TS1 of the portion of the preliminary gate insulating layer 122Pa, which is formed on the substrate 110 corresponding to the side surface of the gate trench 120T, may be greater than the first bottom thickness TB1 of the portion of the preliminary gate insulating layer 122Pa, which is formed on the substrate 110 corresponding to the bottom surface of the gate trench 120T.

A second side thickness TS2 of a portion of the preliminary gate insulating layer 122Pa, which is formed on the device isolation film 116 corresponding to the side surface of the gate trench 120T, may be substantially equal to a second bottom thickness TB2 of a portion of the preliminary gate insulating layer 122Pa, which is formed on the device isolation film 116 corresponding to the bottom surface of the gate trench 120T.

Since the third process for forming the preliminary gate insulating layer 122Pa is an oxidation process or a heat treatment process, in which a time period of an $O_2$-present atmosphere in a process time is relatively short, the thickness of the preliminary gate insulating layer 122Pa may be substantially similar to the thickness of the gate insulating structure 122P or may be greater than the thickness of the gate insulating structure 122P by a few Å or less.

The first side thickness TS1 of the portion of the preliminary gate insulating layer 122Pa, which is formed on the substrate 110 corresponding to the side surface of the gate trench 120T, may be substantially equal to the third thickness T3 (FIG. 7A) of the gate insulating structure 122P, and the first bottom thickness TB1 of the portion of the preliminary gate insulating layer 122Pa, which is formed on the substrate 110 corresponding to the bottom surface of the gate trench 120T, may be substantially equal to the fourth thickness T4 (FIG. 7A) of the gate insulating structure 122P.

The second side thickness TS2 of the portion of the preliminary gate insulating layer 122Pa, which is formed on the device isolation film 116 corresponding to the side surface of the gate trench 120T, may be substantially equal to the fifth thickness T5 (FIG. 7B) of the gate insulating structure 122P, and the second bottom thickness TB2 of the portion of the preliminary gate insulating layer 122Pa, which is formed on the device isolation film 116 corresponding to the bottom surface of the gate trench 120T, may be substantially equal to the sixth thickness T6 (FIG. 7B) of the gate insulating structure 122P. The second side thickness TS2 of the preliminary gate insulating layer 122Pa may be substantially equal to the second bottom thickness TB2 of the preliminary gate insulating layer 122Pa.

In some embodiments, the first bottom thickness TB1 of the preliminary gate insulating layer 122Pa may be equal to or greater than 75% of the first side thickness TS1 thereof and be less than the first side thickness TS1 thereof.

Figure 11A:
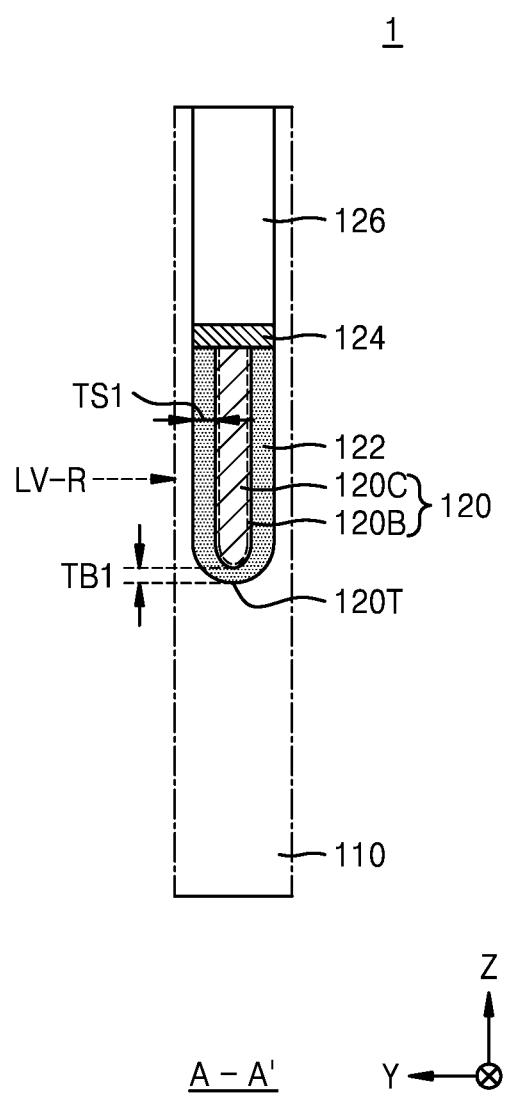
Figure 11B:
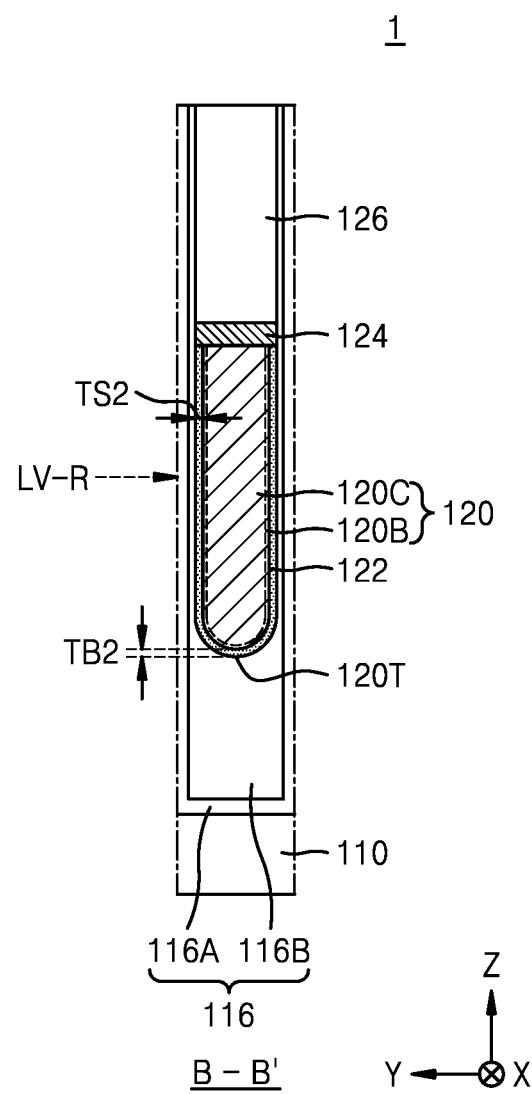
Figure 11C:
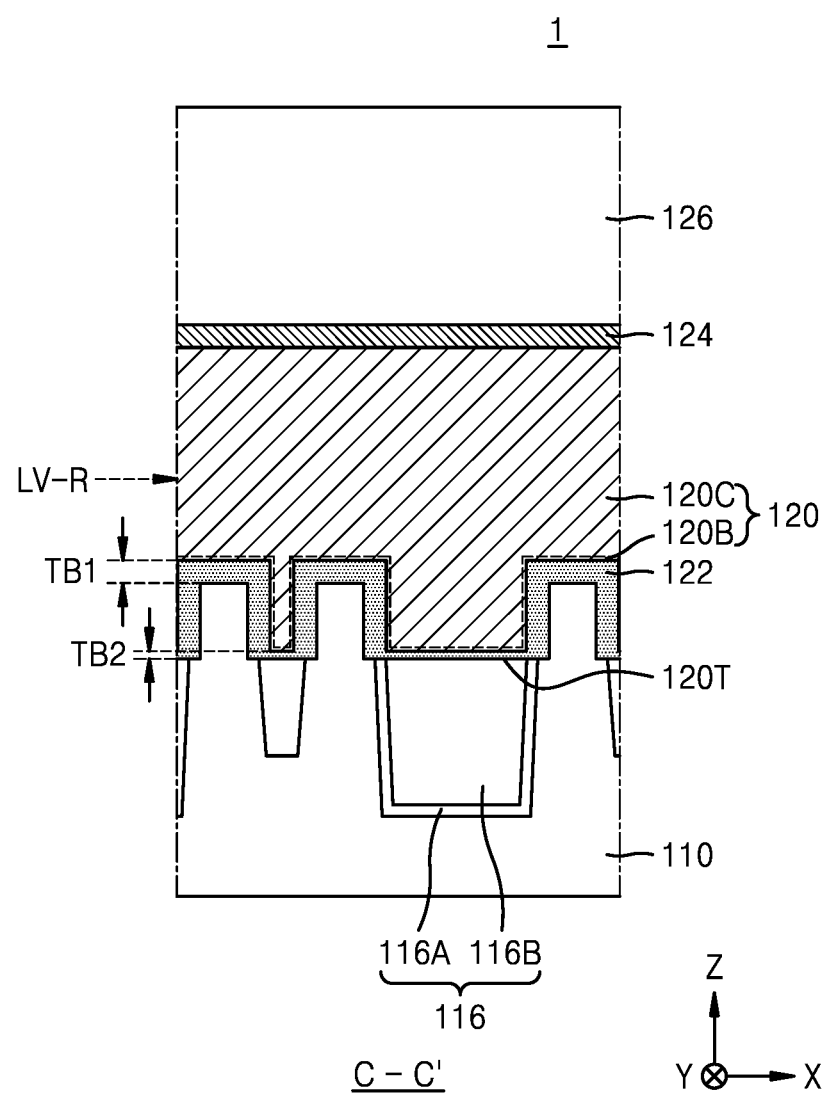
Figure 12A:
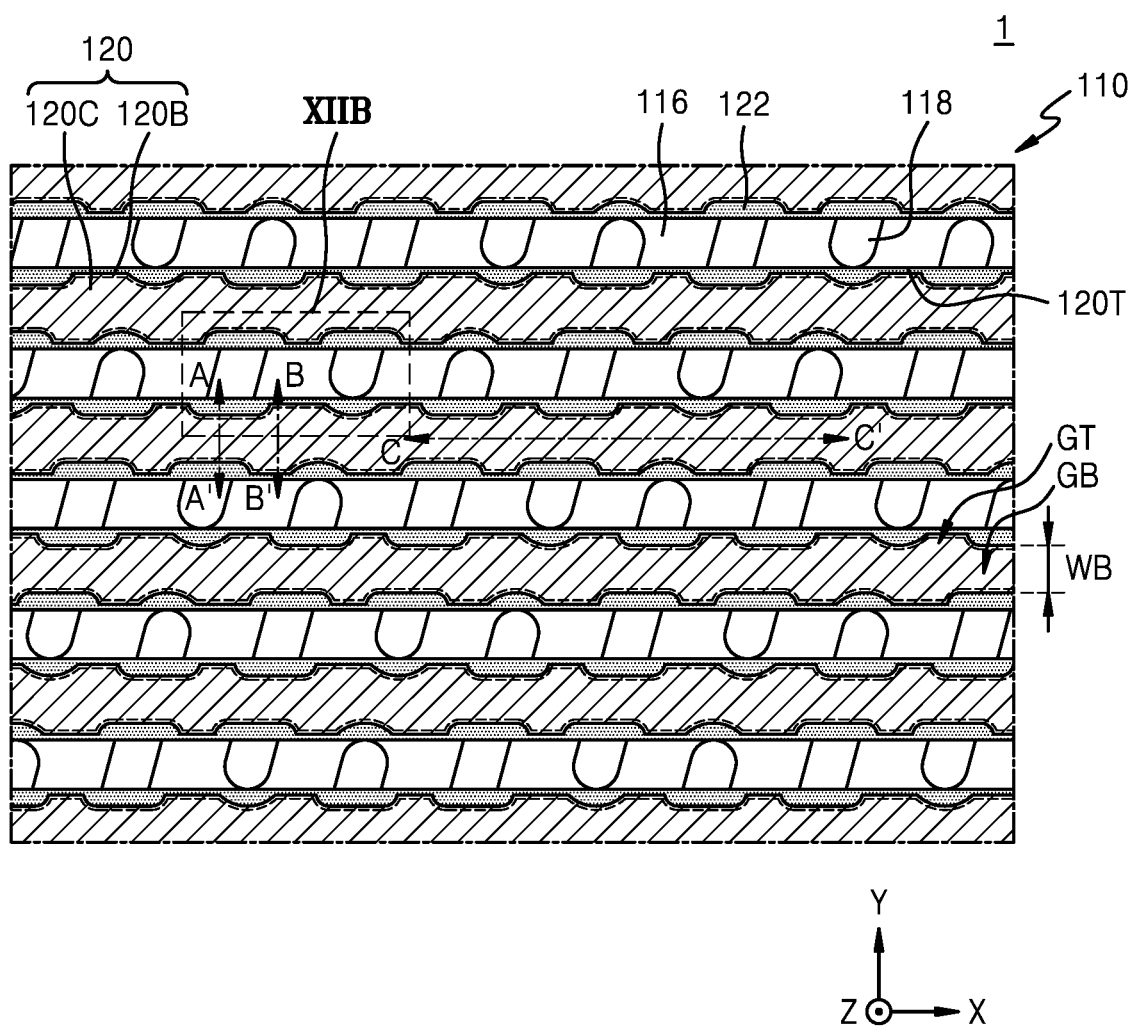
Figure 12B:
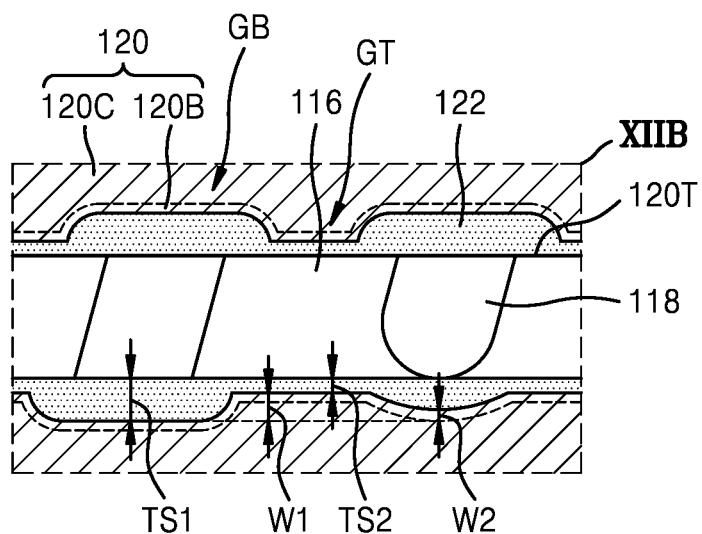

FIGS. 11A to 12B are cross-sectional views illustrating a process of forming a gate insulating layer and a buried gate electrode, according to an example embodiment, and in particular, FIGS. 11A to 11C are cross-sectional views taken along lines A-A', B-B', and C-C' of FIG. 12A, respectively, FIG. 12A is a cross-sectional view taken in the direction parallel to the main surface of the substrate 110 along the reference level LV-R shown in FIGS. 11A to 11C, and FIG. 12B is an enlarged cross-sectional view of a region XIIB of FIG. 12A.

Referring to FIGS. 11A to 12B, a plurality of gate insulating layers 122, a plurality of buried gate electrodes 120, and a plurality of buried insulating films 126 are sequentially formed inside the plurality of gate trenches 120T in this stated order. In some embodiments, a cover layer 124 may be arranged between each of the plurality of buried gate electrodes 120 and each of the plurality of buried insulating films 126.

A semiconductor device 1 includes the plurality of gate insulating layers 122 and the plurality of buried gate electrodes 120, both filling lower portions of the plurality of gate trenches 120T, and the plurality of buried insulating films 126 filling upper portions of the plurality of gate trenches 120T.

A preliminary gate electrode, which fills insides of the plurality of gate trenches 120T and covers the preliminary gate insulating layer 122Pa shown in FIGS. 9A to 10, may be formed, followed by removing portions of the preliminary gate insulating layer 122Pa and the preliminary gate electrode, which cover top surfaces of the active regions 118 and a top surface of the device isolation film 116, and portions of the preliminary gate insulating layer 122Pa and the preliminary gate electrode, which fill upper portions of the plurality of gate trenches 120T, thereby forming the plurality of gate insulating layers 122 and the plurality of buried gate electrodes 120. The plurality of gate insulating layers 122 may be portions of the preliminary gate insulating layer 122Pa, which cover sidewalls and bottom surfaces of the lower portions of the plurality of gate trenches 120T, and the plurality of buried gate electrodes 120 may be portions of the preliminary gate electrode, which are arranged on the plurality of gate insulating layers 122 to fill the lower portions of the plurality of gate trenches 120T.

Like the plurality of gate trenches 120T, the plurality of buried gate electrodes 120 may extend lengthwise in the first horizontal direction (X direction) to be parallel to each other.

In some embodiments, after the forming of the plurality of buried gate electrodes 120, a source/drain region may be formed in the substrate 110 on both sides of each buried gate electrode 120, that is, in an upper portion of each of the plurality of active regions 118 on both sides of each buried gate electrode 120. To form the source/drain region, impurity ions may be implanted into the substrate 110. In some other embodiments, before the forming of the plurality of buried gate electrodes 120, an impurity ion implantation process for forming the source/drain region may be performed.

A top surface of each of the plurality of buried gate electrodes 120 is at a lower level than the top surface of the substrate 110, that is, a top surface of the active region 118. A bottom surface of each of the plurality of buried gate electrodes 120 may have an uneven shape along the bottom surface of each of the plurality of gate trenches 120T, and a saddle fin-type field effect transistor (saddle FINFET) may be formed in each of the plurality of active regions 118.

Each gate insulating layer 122 may include at least one selected from the group consisting of a silicon oxide film, a silicon nitride film, a silicon oxynitride film, ONO, and a high-k dielectric film having a higher dielectric constant than a silicon oxide film. For example, each gate insulating layer 122 may have a dielectric constant of about 10 to about 25. In some embodiments, each gate insulating layer 122 may include at least one selected from the group consisting of hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, each gate insulating layer 122 may include $HfO_2$, $Al_2O_3$, $HfAlO_3$, $Ta_2O_3$, or $TiO_2$.

The top surface of each of the plurality of buried gate electrodes 120 is at a lower level than the top surface of the substrate 110. The bottom surface of each of the plurality of buried gate electrodes 120 may have an uneven shape, and a saddle FINFET may be formed in each of the plurality of active regions 118. In some embodiments, each of the plurality of buried gate electrodes 120 includes at least one selected from the group consisting of Ti, TiN, Ta, TaN, W, WN, TiSiN, and WSiN.

In some embodiments, each of the plurality of buried gate electrodes 120 may include a core layer 120C and a barrier layer 120B between the core layer 120C and a gate insulating layer 122. For example, the core layer 120C may include a metal material, such as W, WN, TiSiN, or WSiN, or a conductive metal nitride, and the barrier layer 120B may include a metal material, such as Ti, TiN, Ta, or TaN, or a conductive metal nitride.

A top surface of each of the plurality of buried insulating films 126 may be at an approximately equal level to the top surface of the substrate 110, that is, the top surface of the active region 118. Each buried insulating film 126 may include a silicon oxide film, a silicon nitride film, a silicon oxynitride film, or a combination thereof.

The cover layer 124 may include, for example, undoped polysilicon or doped polysilicon. In some embodiments, the cover layer 124 may be omitted.

Since the gate insulating layer 122 is a portion of the preliminary gate insulating layer 122Pa, the thickness of a portion of the gate insulating layer 122, which is formed on the substrate 110 corresponding to the side surface of the gate trench 120T, may be the first side thickness TS1 of the preliminary gate insulating layer 122Pa, and the thickness of a portion of the gate insulating layer 122, which is formed on the substrate 110 corresponding to the bottom surface of the gate trench 120T, may be the first bottom thickness TB1 of the preliminary gate insulating layer 122Pa. In addition, the thickness of a portion of the gate insulating layer 122, which is formed on the device isolation film 116 corresponding to the side surface of the gate trench 120T, may be the second side thickness TS2 of the preliminary gate insulating layer 122Pa, and the thickness of a portion of the gate insulating layer 122, which is formed on the device isolation film 116 corresponding to the bottom surface of the gate trench 120T, may be the second bottom thickness TB2 of the preliminary gate insulating layer 122Pa.

In some embodiments, the first bottom thickness TB1 of the gate insulating layer 122 may be equal to or greater than 75% of the first side thickness TS1 thereof and be less than the first side thickness TS1 thereof. The second side thickness TS2 of the gate insulating layer 122 may be substantially equal to the second bottom thickness TB2 thereof.

In addition, the second side thickness TS2 of the gate insulating layer 122 may be less than ½ of the first side thickness TS1 thereof. For example, the first side thickness TS1 of the gate insulating layer 122 may be 80 Å and the second side thickness TS2 thereof may be 20 Å, and in this case, the first side thickness TS1 thereof may be about 4 times the second side thickness TS2 thereof.

Although FIGS. 11A to 12B illustrate that the device isolation film 116 is clearly distinct from the gate insulating layer 122, this is merely for describing a shape of the gate insulating layer 122, such as a thickness change in the gate insulating layer 122, and the inventive concept is not limited thereto. For example, when the device isolation film 116 and the gate insulating layer 122 respectively include similar materials to each other. For example, when each of the device isolation film 116 and the gate insulating layer 122 includes silicon oxide, an interface between the device isolation film 116 and the gate insulating layer 122 may not be observed.

The gate trench 120T may have a substantially constant width in the second horizontal direction (Y direction) and may extend lengthwise in the first horizontal direction (X direction). In addition, since the gate trench 120T is filled with the buried gate electrode 120 and the gate insulating layer 122, in the second horizontal direction (Y direction), the width of the buried gate electrode 120 may be a value obtained by subtracting the width of the gate insulating layer 122 from the width of the gate trench 120T.

The buried gate electrode 120 may include a base portion GB, which has a constant width WB and extends in the first horizontal direction (X direction), and a protrusion GT protruding from the base portion GB in the second horizontal direction (Y direction). The width WB of the base portion GB may be a minimum width of the buried gate electrode 120.

The protrusion GT may protrude to extend from the base portion GB toward the device isolation film 116. Since the second side thickness TS2 of the gate insulating layer 122 is less than ½ of the first side thickness TS1 thereof, a difference between the second side thickness TS2 and the first side thickness TS1 of the gate insulating layer 122 may be greater than ½ of the first side thickness TS1 thereof. The protrusion GT may protrude in the second horizontal direction (Y direction) by as much as the difference between the second side thickness TS2 and the first side thickness TS1 of the gate insulating layer 122. Therefore, a protrusion length W1 of the protrusion GT in the second horizontal direction (Y direction) may be greater than ½ of the first side thickness TS1 of the gate insulating layer 122.

The protrusion GT may protrude from the base portion GB toward the device isolation film 116 arranged on both sides of the base portion GB. The buried gate electrode 120 may have a maximum width in a portion thereof, in which a pair of protrusions GT protruding from the base portion GB in both side directions are aligned in the second horizontal direction (Y direction). Therefore, in the second horizontal direction (Y direction), the buried gate electrode 120 may have a maximum width in a portion thereof having two opposite sides on which the device isolation film 116 is arranged, and a minimum width in a portion thereof having two opposite sides on which cross-sections of the active region 118 are respectively arranged.

Therefore, a difference between the maximum width and the minimum width of the buried gate electrode 120 may be greater than double of ½ of the first side thickness TS1 of the gate insulating layer 122. For example, a difference between the maximum width and the minimum width of the buried gate electrode 120 may be greater than the first side thickness TS1 of the gate insulating layer 122.

In some embodiments, a portion of the buried gate electrode 120 adjacent to the long-axis end of the active region 118 may have a greater width in the second horizontal direction (Y direction) than the base portion GB. For example, a portion of the buried gate electrode 120 between active regions 118, which are adjacent in the X direction, may have a greater width in the second horizontal direction (Y direction) than the base portion GB. In the portion of the buried gate electrode 120 adjacent to the long-axis end of the active region 118, a width W2 increased in the second horizontal direction (Y direction) at one side of the buried gate electrode 120 may be less than the protrusion length W1 of the base portion GB.

Therefore, in the second horizontal direction (Y direction), the buried gate electrode 120 may have a maximum width in the portion thereof having two opposite sides on which the device isolation film 116 is arranged, may have a minimum width in the portion having two opposite sides on which the cross-sections of the active region 118 are respectively arranged, and may have a width between the maximum width and the minimum width in a portion thereof having at least one side on which the long-axis end of the active region 118 is arranged.

In the semiconductor device 1 according to the inventive concept, since the gate insulating layer 122 has relatively good step coverage, even though the first side thickness TS1, which is the thickness of a portion of the gate insulating layer 122 formed on the side surface of the gate trench 120T, is relatively low, the first bottom thickness TB1, which is the thickness of a portion of the gate insulating layer 122 formed on the bottom surface of the gate trench 120T, may secure a certain value or higher. Therefore, the width of the buried gate electrode 120 in the second horizontal direction (Y direction) may be increased while properties of the gate insulating layer 122 are maintained. In addition, since the buried gate electrode 120 has the protrusion GB allowing the width thereof in the second horizontal direction (Y direction) to be increased, an average width of the buried gate electrode 120 may be increased.

Therefore, a value of resistance of the buried gate electrode 120 in the semiconductor device 1 may be reduced, whereby the semiconductor device 1 may exhibit an improved operation speed. In particular, since the first side thickness TS1, which is the thickness of the portion of the gate insulating layer 122 formed on the side surface of the gate trench 120T, may be relatively low, overlap properties between the buried gate electrode 120 and a drain electrode, which is electrically connected to the active region 118, may be improved, whereby a data write speed of the semiconductor device 1 may be improved.

In addition, the first gate insulating layer 122a having relatively dense film quality is formed first on the substrate 110 and the thickness of the first gate insulating layer 122a is greater than the thickness of the second gate insulating layer 122b, whereby insulation properties of the gate insulating layer 122 may be improved. Further, since the proportion of the second gate insulating layer 122b, which is formed by a deposition process, in the gate insulating layer 122 is reduced, a chlorine (Cl) concentration in the gate insulating layer 122 may be reduced and the interface trap density (Nit) and stress in the gate insulating layer 122 may also be reduced, whereby refresh characteristics of the semiconductor device 1 may be improved.

Figure 13:
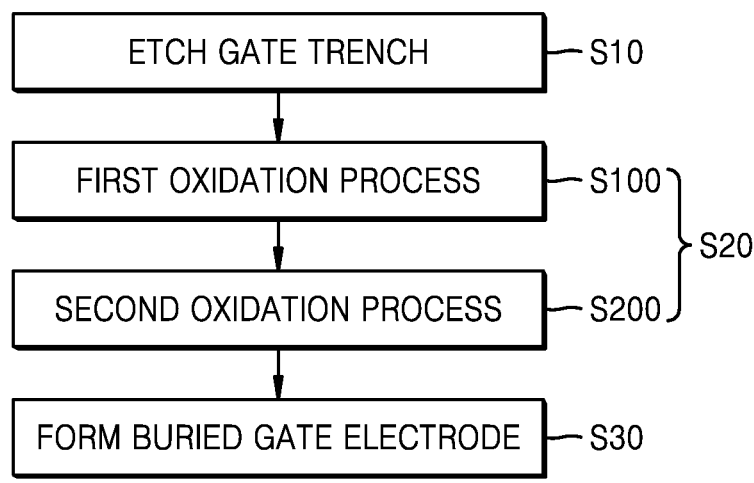
FIGS. 13, 14, and 15 are flowcharts each illustrating a method of manufacturing a semiconductor device, according to an example embodiment.
Figure 14:
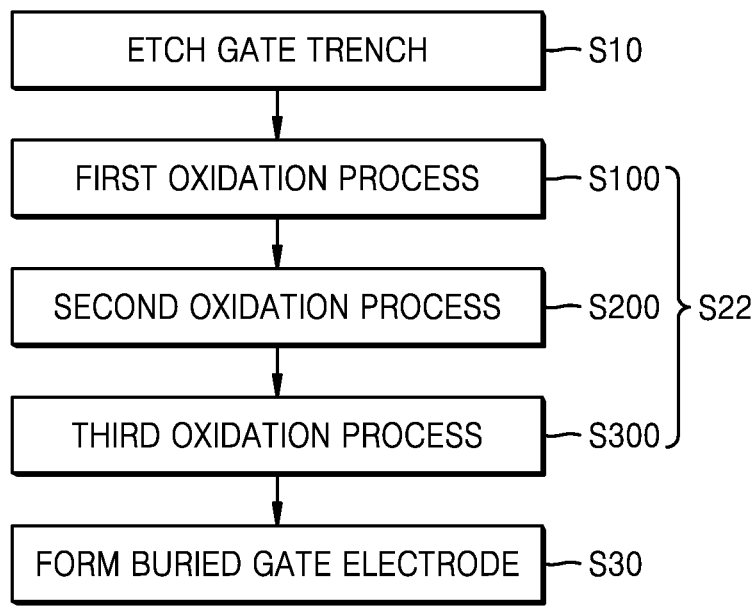
Figure 15:
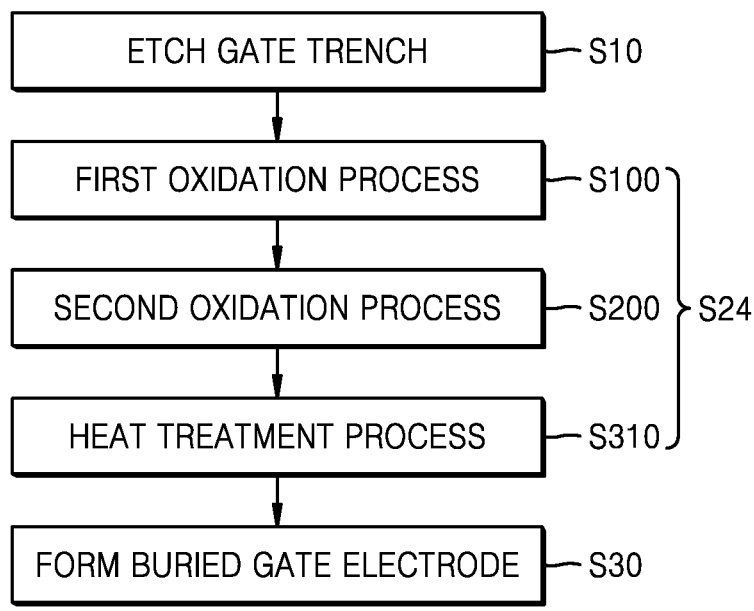

FIGS. 13 to 15 are flowcharts each illustrating a method of manufacturing a semiconductor device, according to an example embodiment.

FIG. 13 illustrates a method of forming the gate insulating layer 122 without performing the third process described with reference to FIGS. 9A to 10.

Referring to FIG. 13 together with FIGS. 2 to 3D, the plurality of gate trenches 120T are formed in the substrate 110 (S10). The plurality of gate trenches 120T may respectively have linear shapes extending lengthwise across the plurality of active regions 118 to be parallel to each other. A portion of each of the plurality of active regions 118 crossed by each gate trench 120T may be exposed at the side surface of each gate trench 120T.

Referring to FIG. 13 together with FIGS. 4 to 6, the first gate insulating layer 122a is formed on the active region 118 by a first oxidation process (S100). The first gate insulating layer 122a may be selectively grown on the substrate 110 including the active region 118. For example, the first oxidation process may include a thermal oxidation process. In some embodiments, the first oxidation process may include an ISSG oxidation process performed in an $O_2+H_2$ atmosphere.

The first gate insulating layer 122a may be formed such that the thickness thereof on the side surface of the gate trench 120T is different from the thickness thereof on the bottom surface of the gate trench 120T. For example, the first thickness T1 of the portion of the first gate insulating layer 122a, which is formed on the side surface of the gate trench 120T, may be greater than the second thickness T2 of the portion of the first gate insulating layer 122a, which is formed on the bottom surface of the gate trench 120T. In some embodiments, the first gate insulating layer 122a may be formed such that the first thickness T1 thereof is equal to or less than approximately 1.5 times the second thickness T2 thereof.

Referring to FIG. 13 together with FIGS. 7A to 8, the second gate insulating layer 122b is formed on the first gate insulating layer 122a and the device isolation film 116 by a second oxidation process (S200). The thickness of the second gate insulating layer 122b may be less than that of the first gate insulating layer 122a. The second gate insulating layer 122b may be conformally formed such that the thickness thereof on the side surface of the gate trench 120T is substantially equal to the thickness thereof on the bottom surface of the gate trench 120T.

The second gate insulating layer 122b may cover both the first gate insulating layer 122a and the device isolation film 116. The second gate insulating layer 122b may also be formed such that the thickness thereof on the first gate insulating layer 122a is substantially equal to the thickness thereof on the device isolation film 116.

For example, the second oxidation process may include a deposition process. In some embodiments, the second oxidation process may include, for example, an ALD process.

Referring to FIG. 13 together with FIGS. 11A to 12B, the first gate insulating layer 122a and the second gate insulating layer 122b are partially removed, thereby forming the gate insulating layer 122, which covers side and bottom surfaces of a lower portion of the gate trench 120T (S20). Next, the buried gate electrode 120 is formed to cover the gate insulating layer 122 and fill the lower portion of the gate trench 120T (S30).

FIG. 14 illustrates a method of forming the gate insulating layer 122 by performing the third oxidation process as the third process described with reference to FIGS. 9A to 10.

Referring to FIG. 14 together with FIGS. 2 to 3D, the plurality of gate trenches 120T are formed in the substrate 110 (S10). The plurality of gate trenches 120T may respectively have linear shapes extending lengthwise in parallel to each other across the plurality of active regions 118. A portion of each of the plurality of active regions 118 crossed by each gate trench 120T may be exposed at the side surface of each gate trench 120T.

Referring to FIG. 14 together with FIGS. 4 to 6, the first gate insulating layer 122a is formed on the active region 118 by a first oxidation process (S100). The first gate insulating layer 122a may be selectively grown on the substrate 110 including the active region 118. For example, the first oxidation process may include a thermal oxidation process. In some embodiments, the first oxidation process may include an ISSG oxidation process performed in an $O_2+H_2$ atmosphere.

The first gate insulating layer 122a may be formed such that the thickness thereof on the side surface of the gate trench 120T is different from the thickness thereof on the bottom surface of the gate trench 120T. For example, the first thickness T1 of the portion of the first gate insulating layer 122a, which is formed on the side surface of the gate trench 120T, may be greater than the second thickness T2 of the portion of the first gate insulating layer 122a, which is formed on the bottom surface of the gate trench 120T. In some embodiments, the first gate insulating layer 122a may be formed such that the first thickness T1 thereof is equal to or less than approximately 1.5 times the second thickness T2 thereof.

Referring to FIG. 14 together with FIGS. 7A to 8, the second gate insulating layer 122b is formed on the first gate insulating layer 122a and the device isolation film 116 by a second oxidation process (S200). The thickness of the second gate insulating layer 122b may be less than that of the first gate insulating layer 122a. The second gate insulating layer 122b may be conformally formed such that the thickness thereof on the side surface of the gate trench 120T is substantially equal to the thickness thereof on the bottom surface of the gate trench 120T.

The second gate insulating layer 122b may cover both the first gate insulating layer 122a and the device isolation film 116. The second gate insulating layer 122b may also be formed such that the thickness thereof on the first gate insulating layer 122a is substantially equal to the thickness thereof on the device isolation film 116.

For example, the second oxidation process may include a deposition process. In some embodiments, the second oxidation process may include, for example, an ALD process.

Referring to FIG. 14 together with FIGS. 9A to 10, the preliminary gate insulating layer 122Pa is formed, by a third oxidation process, from the gate insulating structure 122P including the first gate insulating layer 122a and the second gate insulating layer 122b (S300).

For example, the third oxidation process may include an ISSG oxidation process performed in an $O_2+H_2$ atmosphere, or an ISSG oxidation process performed in an atmosphere changing from an $O_2+H_2$ atmosphere to an $O_2$ atmosphere. In some other embodiments, the third oxidation process may include a dry oxidation process.

In some embodiments, when the third oxidation process includes an ISSG oxidation process performed in an atmosphere changing from an $O_2+H_2$ atmosphere to an $O_2$ atmosphere, in a process time of the third oxidation process, a time period of the $O_2+H_2$ atmosphere may be less than a time period of the $O_2$ atmosphere. For example, in the process time of the third oxidation process, a time period for which $O_2$ is present in the atmosphere may be relatively short.

In some embodiments, when the first oxidation process includes an ISSG oxidation process performed in an $O_2+H_2$ atmosphere and the third oxidation process includes an ISSG oxidation process performed in an $O_2+H_2$ atmosphere or an atmosphere changing from an $O_2+H_2$ atmosphere to an $O_2$ atmosphere, the time period of the $O_2+H_2$ atmosphere in the process time of the third oxidation process may be less than a time period of the $O_2+H_2$ atmosphere in a process time of the first oxidation process.

In some embodiments, the process time of the third oxidation process may be less than the process time of the first oxidation process.

Referring to FIG. 14 together with FIGS. 11A to 12B, the preliminary gate insulating layer 122Pa is partially removed, thereby forming the gate insulating layer 122, which covers the side and bottom surfaces of the lower portion of the gate trench 120T (S22). Next, the buried gate electrode 120 is formed to cover the gate insulating layer 122 and fill the lower portion of the gate trench 120T (S30).

FIG. 15 illustrates a method of forming the gate insulating layer 122 by performing a heat treatment process as the third process described with reference to FIGS. 9A to 10.

Referring to FIG. 15 together with FIGS. 2 to 3D, the plurality of gate trenches 120T are formed in the substrate 110 (S10). The plurality of gate trenches 120T may respectively have linear shapes extending lengthwise in parallel to each other across the plurality of active regions 118. A portion of each of the plurality of active regions 118 crossed by each gate trench 120T may be exposed at the side surface of each gate trench 120T.

Referring to FIG. 15 together with FIGS. 4 to 6, the first gate insulating layer 122a is formed on the active region 118 by a first oxidation process (S100). The first gate insulating layer 122a may be selectively grown on the substrate 110 including the active region 118. For example, the first oxidation process may include a thermal oxidation process. In some embodiments, the first oxidation process may include an ISSG oxidation process performed in an $O_2+H_2$ atmosphere.

The first gate insulating layer 122a may be formed such that the thickness thereof on the side surface of the gate trench 120T is different from the thickness thereof on the bottom surface of the gate trench 120T. For example, the first thickness T1 of the portion of the first gate insulating layer 122a, which is formed on the side surface of the gate trench 120T, may be greater than the second thickness T2 of the portion of the first gate insulating layer 122a, which is formed on the bottom surface of the gate trench 120T. In some embodiments, the first gate insulating layer 122a may be formed such that the first thickness T1 thereof is equal to or less than approximately 1.5 times the second thickness T2 thereof.

Referring to FIG. 15 together with FIGS. 7A to 8, the second gate insulating layer 122b is formed on the first gate insulating layer 122a and the device isolation film 116 by a second oxidation process (S200). The thickness of the second gate insulating layer 122b may be less than that of the first gate insulating layer 122a. The second gate insulating layer 122b may be conformally formed such that the thickness thereof on the side surface of the gate trench 120T is substantially equal to the thickness thereof on the bottom surface of the gate trench 120T.

The second gate insulating layer 122b may cover both the first gate insulating layer 122a and the device isolation film 116. The second gate insulating layer 122b may also be formed such that the thickness thereof on the first gate insulating layer 122a is substantially equal to the thickness thereof on the device isolation film 116.

For example, the second oxidation process may include a deposition process. In some embodiments, the second oxidation process may include, for example, an ALD process.

Referring to FIG. 15 together with FIGS. 9A to 10, the preliminary gate insulating layer 122Pa is formed, by a heat treatment process, from the gate insulating structure 122P including the first gate insulating layer 122a and the second gate insulating layer 122b (S310).

For example, the heat treatment process may be performed by an RTP method or an annealing method.

Referring to FIG. 15 together with FIGS. 11A to 12B, the preliminary gate insulating layer 122Pa is partially removed, thereby forming the gate insulating layer 122, which covers the side and bottom surfaces of the lower portion of the gate trench 120T (S24). Next, the buried gate electrode 120 is formed to cover the gate insulating layer 122 and fill the lower portion of the gate trench 120T (S30).

Figure 16:
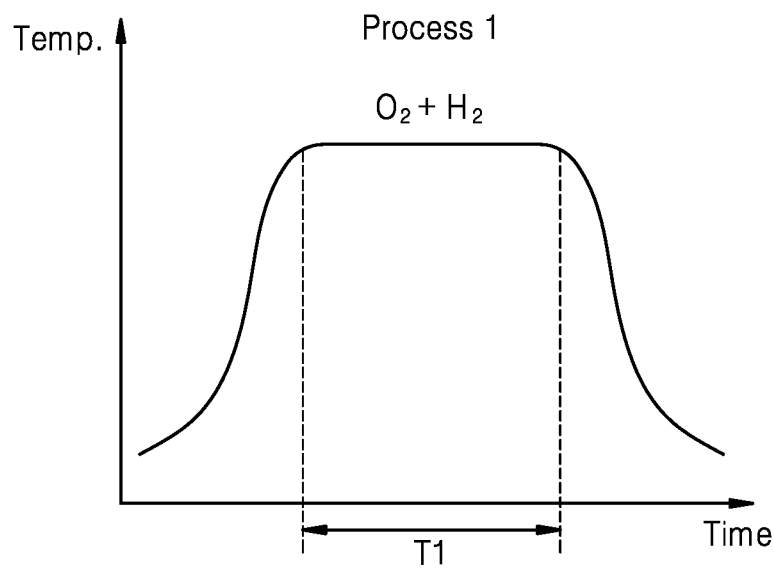
FIG. 16 is a graph illustrating a first process of a method of manufacturing a semiconductor device, according to an example embodiment.
Figure 17:
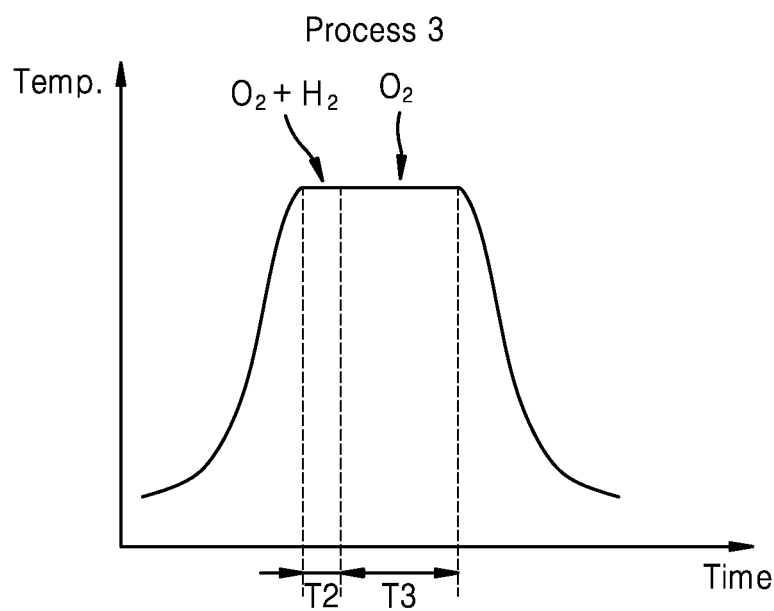
FIG. 17 is a graph illustrating a third process of a method of manufacturing a semiconductor device, according to an example embodiment.

FIG. 16 is a graph illustrating a first process of a method of manufacturing a semiconductor device, according to an example embodiment, and FIG. 17 is a graph illustrating a third process of a method of manufacturing a semiconductor device, according to an example embodiment.

Referring to FIGS. 16 and 17, a first process Process 1 may be an ISSG oxidation process performed in an $O_2+H_2$ atmosphere, and a third process Process 3 may be an ISSG oxidation process performed in an atmosphere changing from an $O_2+H_2$ atmosphere to an $O_2$ atmosphere.

A process time of the first process Process 1 may be a first time period TL, and a process time of the third process Process 3 may be a sum of a second time period T2 and a third time period T3. Here, the process time refers to a time period for which a process temperature and a process atmosphere for performing each of the first process Process 1 and the third process Process 3 are maintained, and the process time does not include a ramp up time and a cool down time.

The first process Process 1 may be in the $O_2+H_2$ atmosphere for the first time period T1, and the third process Process 3 may be in the $O_2+H_2$ atmosphere for the second time period T2 and be in the $H_2$ atmosphere for the third time period T3. In the third process Process 3, the third time period T3 may be less than the second time period T2 and each of the second time period T2 and the third time period T3 may be less than the first time period T1. In some embodiments, the sum of the second time period T2 and the third time period T3 may be less than the first time period T1.

For example, the first time period T1, the second time period T2, and the third time period T3 may be about 40 seconds, about 1 second, and about 20 seconds, respectively. However, this is merely an example and the inventive concept is not limited thereto.

A time period of supplying oxygen, that is, the second time period T2 for the $O_2+H_2$ atmosphere, in the process time of the third process Process 3 may be relatively much less than a time period of supplying oxygen, that is, the first time period T1 for the $O_2+H_2$ atmosphere, in the process time of the first process Process 1. Therefore, the thickness of the preliminary gate insulating layer 122Pa (FIGS. 9A to 10) after the third process Process 3 may be almost similar to the thickness of the gate insulating structure 122P or be greater than the thickness of the gate insulating structure 122P by a few Å or less.

For example, the thickness of the gate insulating layer 122 described with reference to FIGS. 1 to 12B and 14 is substantially determined by the first process Process 1 and the second process, and the third process Process 3 may remove impurities included in the gate insulating structure 122P, make the gate insulating layer 122 dense, or heal interfacial defects between the gate insulating structure 122P and the substrate 110 or defects between the first gate insulating layer 122a and the second gate insulating layer 122b and may scarcely contribute to the thickness of the gate insulating layer 122. Therefore, even though the third process Process 3 is performed, the step coverage of the gate insulating layer 122 may be maintained without any great change.

Figure 18:
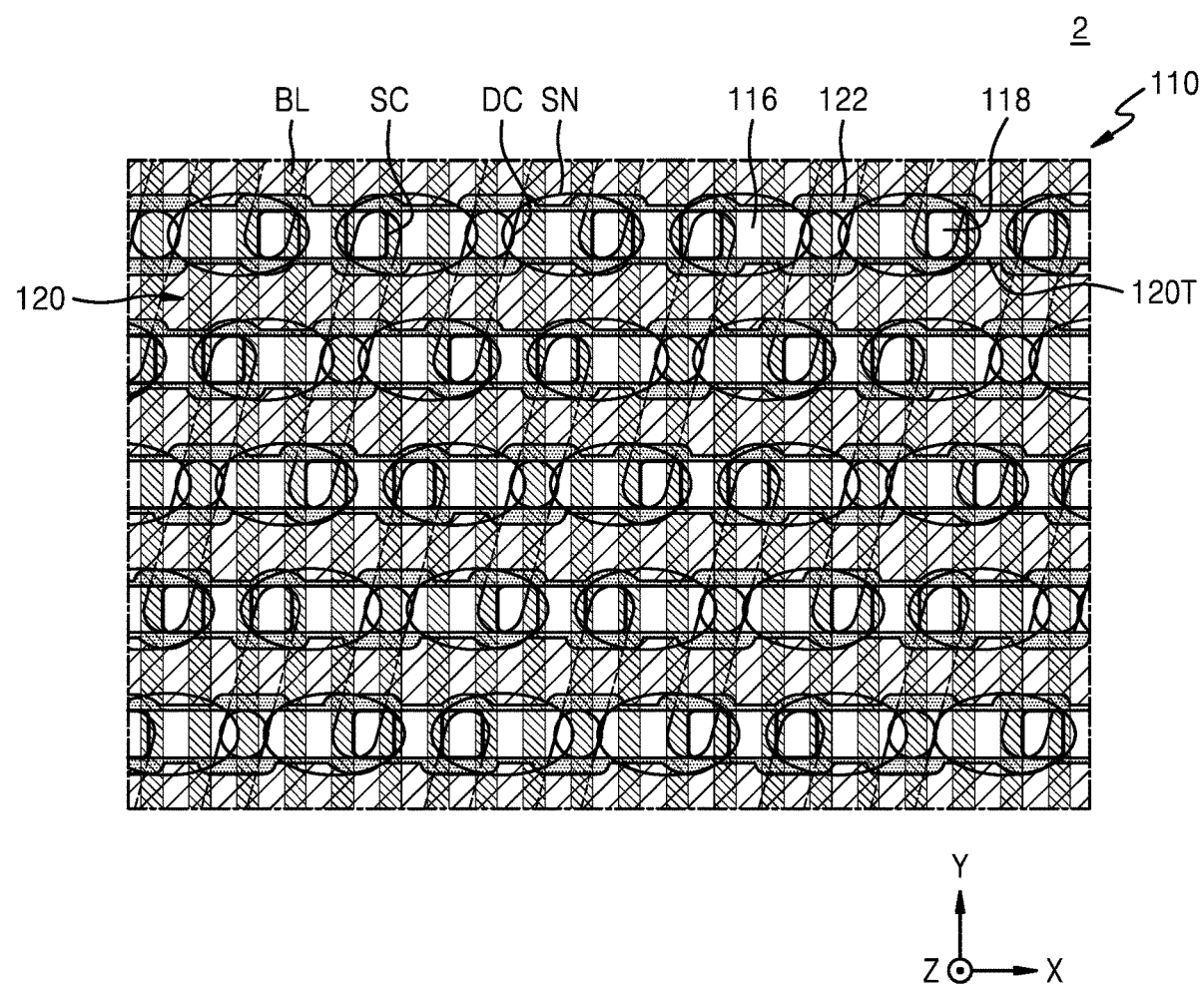
FIG. 18 is a schematic planar layout illustrating main components of a semiconductor device manufactured by a method of manufacturing a semiconductor device, according to an example embodiment.

FIG. 18 is a schematic planar layout illustrating main components of a semiconductor device manufactured by a method of manufacturing a semiconductor device, according to an example embodiment. Regarding FIG. 18, repeated descriptions given with reference to FIGS. 1 to 17 will be omitted.

Referring to FIG. 18, a semiconductor device 2 includes the device isolation film 116 defining the plurality of active regions 118 in the substrate 110. Each of the plurality of active regions 118 may have a relatively long island shape having a short axis and a long axis. For example, each of the plurality of active regions 118 may have a short axis and a long axis in oblique directions with respect to the first horizontal axis (X direction) and the second horizontal axis (Y direction). The plurality of gate trenches 120T may respectively have linear shapes extending lengthwise in parallel to each other in the first horizontal axis (X direction) across the plurality of active regions 118. The plurality of buried gate electrodes 120 may be arranged respectively in the plurality of gate trenches 120T to extend parallel to each other in the first horizontal axis (X direction) across the plurality of active regions 118. The plurality of gate insulating layers 122 may each be arranged between each of the plurality of gate trenches 120T and each of the plurality of buried gate electrodes 120.

Since each of the plurality of buried gate electrodes 120 may have an increased width in a portion thereof having two opposite sides on which the device isolation film 116 is arranged in the second horizontal axis (Y direction), an average width of each buried gate electrode 120 may be increased.

A plurality of bit lines BL may be arranged over the buried gate electrodes 120 to extend parallel to each other in the second horizontal axis (Y direction) that intersects with the first horizontal axis (X direction). Each of the plurality of bit lines BL may be connected to each of the plurality of active regions 118 via a direct contact DC.

A plurality of storage contacts SC may each connect a lower electrode SN of a capacitor over each bit line BL to each active region 118. Each of the plurality of storage contacts SC may include a buried contact, which is arranged between two adjacent bit lines BL among the plurality of bit lines BL, and a conductive landing pad arranged on the buried contact. The conductive landing pad constituting each storage contact SC may at least partially overlap the buried contact.

In some embodiments, the direct contact DC may include Si, Ge, W, WN, Co, Ni, Al, Mo, Ru, Ti, TiN, Ta, TaN, Cu, or a combination thereof. In some embodiments, the direct contact DC may include an epitaxial silicon layer.

In some embodiments, although each of the plurality of bit lines BL may include a lower conductive layer, an intermediate conductive layer, and an upper conductive layer, which are sequentially formed over the substrate 110 in this stated order, the inventive concept is not limited thereto. For example, each of the plurality of bit lines BL may include a single layer, a double layer, or a quadruple- or higher-layered stack structure.

A top surface of the lower conductive layer and a top surface of the direct contact DC may extend on the same plane. In some embodiments, the lower conductive layer may include conductive polysilicon. Each of the intermediate conductive layer and the upper conductive layer may include TiN, TiSiN, W, tungsten silicide, or a combination thereof. For example, the intermediate conductive layer may include TiN and/or TiSiN and the upper conductive layer may include W. A plurality of insulating capping patterns may be respectively arranged on the plurality of bit lines BL. Each of the plurality of insulating capping patterns may include, for example, a silicon nitride film. The plurality of storage contacts SC are spaced apart from the plurality of bit lines BL with a plurality of insulating spacers SPC1 therebetween.

A plurality of buried contacts, which respectively constitute the plurality of storage contacts SC, may respectively have pillar shapes extending on the substrate 110 in the vertical direction (Z direction) along spaces between the plurality of bit lines BL. A bottom surface of each of the plurality of buried contacts may contact each active region 118. A portion of each of the plurality of buried contacts may be at a lower level than the top surface of the substrate 110 to be buried in the substrate 110. Each of the plurality of buried contacts may include an impurity-doped semiconductor material, a metal, a conductive metal nitride, or a combination thereof, without being limited thereto.

A plurality of conductive landing pads, which respectively constitute the plurality of storage contacts SC, may each include a conductive barrier film and a conductive layer. The conductive barrier film may include Ti, TiN, or a combination thereof. The conductive layer may include a metal, a metal nitride, conductive polysilicon, or a combination thereof. For example, the conductive layer may include tungsten (W).

The plurality of conductive landing pads may respectively have a plurality of island pattern shapes. The plurality of conductive landing pads may be electrically insulated from each other by an insulating film that fills spaces around the plurality of conductive landing pads. The insulating film may include a silicon nitride film, a silicon oxide film, or a combination thereof.

A plurality of metal silicide films may each be arranged between the plurality of buried contacts and the plurality of conductive landing pads. In each of the plurality of storage contacts SC, a metal silicide film and the conductive landing pad may vertically overlap the buried contact. In some embodiments, the metal silicide film may include cobalt silicide, nickel silicide, or manganese silicide, without being limited thereto. Each of the plurality of metal silicide films may be connected to the buried contact via the metal silicide film.

Although FIG. 18 illustrates a dynamic random access memory (DRAM) device as an example of the semiconductor device, the semiconductor device according to the inventive concept is not limited to the DRAM device. For example, the semiconductor device according to the inventive concept may be any semiconductor device having the buried gate electrode 120.

While the inventive concept has been particularly shown and described with reference to embodiments thereof, it will be understood that various changes in form and details may be made therein without departing from the spirit and scope of the following claims.

The invention claimed is:

1. A semiconductor device comprising:
 a substrate including an active region defined by a device isolation film;
 a gate trench disposed in the substrate and crossing the active region and the device isolation film in a first direction that is parallel to a top surface of the substrate;
 a gate insulating layer disposed in the gate trench; and
 a gate electrode disposed on the gate insulating layer and fully buried in the gate trench,
 wherein the gate electrode includes a first portion and a plurality of second portions disposed at a plurality of portions of a side of the first portion,
 wherein the first portion of the gate electrode crosses the active region and the device isolation film in the first direction,
 wherein the plurality of second portions of the gate electrode are disposed on the device isolation film and extend from the plurality of portions of the side of the first portion of the gate electrode in a second direction that is perpendicular to the first direction, and
 wherein a bottom surface of the gate insulating layer is rounded, when viewed in a cross-section in the second direction.

2. The semiconductor device of claim 1,
 wherein the gate insulating layer includes a first side surface that is adjacent to the gate electrode and a second side surface that is opposite to the first side surface of the gate insulating layer, and the first side surface of the gate insulating layer includes a convex portion, and the second side surface of the gate insulating layer is more flat than the first side surface of the gate insulating layer.

3. The semiconductor device of claim 2, wherein the convex portion of the first side surface of the gate insulating layer is disposed on the active region.

4. The semiconductor device of claim 1, wherein a width of each of the plurality of second portions of the gate electrode in the second direction is greater than a half of a width of the gate insulating layer in the second direction.

5. The semiconductor device of claim 1, wherein the gate electrode includes a maximum width and a minimum width in a plan view, and a difference between the maximum width and the minimum width of the gate electrode is greater than a width of the gate insulating layer in the second direction.

6. The semiconductor device of claim 1, wherein a width of a portion of the gate electrode disposed on the active region is less than a width of a portion of the gate electrode disposed on the device isolation film.

7. The semiconductor device of claim 1, wherein a thickness of a portion of the gate insulating layer that is disposed on a side surface of the active region exposed by the gate trench is greater than a thickness of a portion of the gate insulating layer that is disposed on a bottom surface of the active region exposed by the gate trench.

8. The semiconductor device of claim 1, wherein a width of a portion of the gate insulating layer that is disposed on the active region is greater than a width of a portion of the gate insulating layer that is disposed on the device isolation film in a plan view.

9. The semiconductor device of claim 1, wherein a thickness of a portion of the gate insulating layer that is disposed on a bottom surface of the active region exposed by the gate trench is greater than a thickness of a portion of the gate insulating layer that is disposed on a bottom surface of the device isolation film exposed by the gate trench.

10. The semiconductor device of claim 1, wherein a thickness of a portion of the gate insulating layer that is disposed on a side surface of the device isolation film exposed by the gate trench is substantially equal to a thickness of a portion of the gate insulating layer that is disposed on a bottom surface of the device isolation film exposed by the gate trench.

11. A semiconductor device comprising:
a substrate including a plurality of active regions defined by a device isolation film, the plurality of active regions including a plurality of inner side surfaces and a plurality of inner bottom surfaces, the device isolation film including a plurality of inner side surfaces and a plurality of inner bottom surfaces;
a gate electrode fully buried in the substrate and crossing the plurality of active regions and the device isolation film in a first direction that is parallel to a top surface of the substrate, the gate electrode including a plurality of first portions that are disposed on the plurality of active regions and a plurality of second portions that are disposed on the device isolation film; and
a gate insulating layer including a plurality of first portions that are disposed between the plurality of inner side surfaces of the plurality of active regions and the plurality of first portions of the gate electrode, and a plurality of second portions that are disposed between the plurality of inner side surfaces of the device isolation film and the plurality of second portions of the gate electrode, wherein a width of each of the plurality of first portions of the gate insulating layer in a second direction that is perpendicular to the first direction is greater than a width of each of the plurality of second portions of the gate insulating layer in the second direction, and wherein a bottom surface of the gate insulating layer is rounded, when viewed in a cross-section in the second direction.

12. The semiconductor device of claim 11,
wherein the gate insulating layer includes a first side surface that is adjacent to the gate electrode and a second side surface that is opposite to the first side surface of the gate insulating layer, and
the first side surface of the gate insulating layer includes a convex portion, and the second side surface of the gate insulating layer is more flat than the first side surface of the gate insulating layer.

13. The semiconductor device of claim 12, wherein the convex portion of the first side surface of the gate insulating layer is disposed on the active region.

14. The semiconductor device of claim 11, wherein the width of each of the plurality of second portions of the gate insulating layer is less than a half of the width of each of the plurality of first portions of the gate insulating layer in the second direction.

15. The semiconductor device of claim 11, wherein a width of each of a plurality of third portions of the gate insulating layer that are disposed between the plurality of inner bottom surfaces of the plurality of active regions and the plurality of first portions of the gate electrode in a third direction that is perpendicular to a top surface of the substrate is greater than a width of a plurality of fourth portions of the gate insulating layer that are disposed between the plurality of inner bottom surfaces of the device isolation film and the plurality of second portions of the gate electrode in the third direction.

16. The semiconductor device of claim 15, wherein the width of each of the plurality of first portions of the gate insulating layer in the second direction is greater than the width of each of the plurality of third portions of the gate insulating layer in the third direction.

17. The semiconductor device of claim 15, wherein the width of each of the plurality of second portions of the gate insulating layer in the second direction is substantially equal to the width of each of the plurality of fourth portions of the gate insulating layer in the third direction.

18. The semiconductor device of claim 11, wherein a width of each of the plurality of first portions of the gate electrode in the second direction is less than a width of each of the plurality of second portions of the gate electrode in the second direction.

19. A semiconductor device comprising:
a substrate including a plurality of active regions defined by a device isolation film;
a gate electrode fully buried in the substrate and crossing the plurality of active regions and the device isolation film in a first direction that is perpendicular to a top surface of the substrate, the gate electrode including a plurality of first portions that are disposed on the plurality of active regions and a plurality of second portions that are disposed on the device isolation film; and
a gate insulating layer including a plurality of first portions that are disposed on the plurality of active regions and contact the plurality of first portions of the gate electrode, and a plurality of second portions that are disposed on the device isolation film and contacts the plurality of second portions of the gate electrode, wherein a width of each of the plurality of first portions of the gate electrode in a second direction that is perpendicular to the first direction is less than a width of each of the plurality of second portions of the gate electrode in the second direction, wherein a width of each of the plurality of first portions of the gate insulating layer in the second direction is greater than a width of each of the plurality of second portions of the gate insulating layer in the second direction, wherein the gate insulating layer includes a first side surface that is adjacent to the gate electrode and a second side surface that is opposite to the first side surface of the gate insulating layer, wherein the first side surface of the gate insulating layer includes a convex portion, wherein the second side surface of the gate insulating layer is more flat than the first side surface of the gate insulating layer, and wherein a bottom surface of the gate insulating layer is rounded, when viewed in a cross-section in the second direction.

20. The semiconductor device of claim 19, wherein the convex portion of the first side surface of the gate insulating layer is disposed on the active region.

21. A semiconductor device comprising:
a substrate including an active region and a device isolation region around the active region;
a gate electrode fully buried in the substrate, and crossing the active region and the device isolation region of the substrate in a first direction that is parallel to a top surface of the substrate;
a gate insulating layer between the substrate and the gate electrode;
a cover layer arranged on the gate electrode and including doped polysilicon; and
a buried insulating film on the cover layer,
wherein a width of the gate electrode on the device isolation region of the substrate in a second direction that is perpendicular to the first direction is greater than a width of the gate electrode on the active region of the substrate in the second direction.

* * * * *